(12) United States Patent
Park et al.

(10) Patent No.: US 11,527,192 B2
(45) Date of Patent: Dec. 13, 2022

(54) INPUT SENSING DEVICE AND DISPLAY DEVICE INCLUDING THE SAME

(71) Applicant: SAMSUNG DISPLAY CO., LTD., Yongin-si (KR)

(72) Inventors: Kyung Tea Park, Yongin-si (KR); Jong Hyun Lee, Yongin-si (KR); Kang Bin Jo, Yongin-si (KR); Go Eun Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/331,235

(22) Filed: May 26, 2021

(65) Prior Publication Data

US 2022/0051609 A1 Feb. 17, 2022

(30) Foreign Application Priority Data

Aug. 14, 2020 (KR) ........................ 10-2020-0102731

(51) Int. Cl.
*G09G 3/20* (2006.01)
*G06F 3/041* (2006.01)

(52) U.S. Cl.
CPC ......... *G09G 3/2092* (2013.01); *G06F 3/0412* (2013.01); *G06F 3/0414* (2013.01); *G06F 3/04164* (2019.05); *G09G 2310/0267* (2013.01)

(58) Field of Classification Search
CPC .......... G09G 3/2092; G09G 3/20; G09G 3/32; G09G 3/3208; G09G 3/3233; G09G 2300/0413; G09G 2310/0267; G09G 2310/0245; G09G 2310/0278; G09G 2310/0297; G09G 2360/148;
(Continued)

(56) References Cited

U.S. PATENT DOCUMENTS

2005/0057673 A1* 3/2005 Shimomura ......... H04N 5/3454
348/E3.02
2005/0212916 A1* 9/2005 Nakamura ............ G06F 3/0412
348/207.99
2017/0103247 A1* 4/2017 Mizuhashi ......... G06V 40/1306
(Continued)

FOREIGN PATENT DOCUMENTS

KR 10-2019-0033235 A 3/2019
KR 10-2019-0047790 A 5/2019
(Continued)

*Primary Examiner* — David Tung
(74) *Attorney, Agent, or Firm* — Lewis Roca Rothgerber Christie LLP

(57) ABSTRACT

An input sensing device includes sensor pixels initialized in response to a reset signal provided through a reset line, and output a sensing signal to a read-out line in response to a scan signal provided through a scan line. A controller generates at least one start signal and dock signals. A selector selectively provides the at least one start signal and the dock signals to first control lines or second control lines. A reset driver connected to the first control lines, and supplying reset signals to at least some of the reset lines based on the at least one start signal and the clock signals provided through the first control lines. A scan driver is connected to the second control lines, and supplies scan signals to at least some of the scan lines based on the at least one start signal and the clock signals.

20 Claims, 16 Drawing Sheets

(58) Field of Classification Search
CPC . G09G 2358/00; G06F 3/0412; G06F 3/0414; G06F 3/04164; G11C 19/28; G06V 40/1318
See application file for complete search history.

(56) References Cited

U.S. PATENT DOCUMENTS

2017/0277931 A1* 9/2017 Uehara ............... G02F 1/13338
2019/0087620 A1 3/2019 Kim et al.

FOREIGN PATENT DOCUMENTS

KR 10-2019-0079859 A 7/2019
KR 10-2019-0081730 A 7/2019

\* cited by examiner

INPUT SENSING DEVICE AND DISPLAY DEVICE INCLUDING THE SAME

CROSS-REFERENCE TO RELATED APPLICATION

The present application claims priority to and the benefit of Korean Patent Application No. 10-2020-0102731 filed in the Korean Intellectual Property Office on Aug. 14, 2020, the entire content of which is incorporated herein by reference.

BACKGROUND

1. Field

Aspects of some example embodiments of the present invention relate to an input sensing device and a display device including the same.

2. Description of the Related Art

Recently, as display devices such as smart phones or tablet PCs are utilized in various fields, a biometric information authentication method using a user's fingerprint or the like has been widely used. In order to provide a fingerprint sensing function, a fingerprint sensor may be provided in a form of being embedded in a display device or attached to an upper portion and/or a lower portion of the display device. Such a fingerprint sensor integrated display device is referred to as a fingerprint on display (FoD).

The FoD, for example, may be configured with a light sensing type sensor. The light sensing type FoD may use a light emitting element provided in a pixel as a light source, and may include a photo sensor array. The photo sensor array may be implemented as, for example, a CMOS image sensor (CIS).

As the FoD becomes larger, the FoD includes a greater number of photo sensors, and an input detector (or read-out IC) requires a greater number of channels (or, signal lines) for driving the photo sensors and receiving sensing signals from the photo sensors.

The above information disclosed in this Background section is only for enhancement of understanding of the background and therefore the information discussed in this Background section does not necessarily constitute prior art.

SUMMARY

Aspects of some example embodiments of the present invention include an input sensing device and a display device including the same that may reduce the number of channels (or the number of signal lines) of an input detector and reduce a manufacturing cost.

Embodiments according to the present invention are not limited to the above-described characteristics, and may be variously extended without departing from the spirit and scope of embodiments according to the present invention.

Aspects of some example embodiments of the present invention include an input sensing device including: reset lines; scan lines; read-out lines; sensor pixels that are connected to the reset lines, the scan lines, and the read-out lines, wherein each of the sensor pixels is initialized in response to a reset signal provided through a corresponding reset line among the reset lines and outputs a sensing signal to a corresponding read-out line among the read-out lines in response to a scan signal provided through a corresponding scan line among the scan lines; a controller that generates at least one start signal and dock signals; a selector that selectively provides the at least one start signal and the dock signals to first control lines or second control lines; a reset driver that is connected to the first control lines and supplies reset signals to at least some of the reset lines based on the at least one start signal and the dock signals provided through the first control lines; and a scan driver that is connected to the second control lines and supplies scan signals to at least some of the scan lines based on the at least one start signal and the dock signals provided through the second control lines.

According to some example embodiments, the controller may output the at least one start signal and the dock signals to reference control lines; and the selector may include a first switching unit connected between the reference control lines and the first control lines, and respectively connecting the reference control lines and the first control lines in response to a reset enable signal; and a second switching unit connected between the reference control lines and the second control lines, and respectively connecting the reference control lines and the second control lines in response to a scan enable signal.

According to some example embodiments, each of the sensor pixels may be divided into a plurality of unit blocks including at least one sensor pixel, the reset driver may include sub-reset drivers respectively corresponding to the unit blocks, wherein each of the sub-reset drivers may provide corresponding reset signals among the reset signals to a corresponding unit block among the unit blocks, and the controller may generate start signals respectively corresponding to the sub-reset drivers.

According to some example embodiments, each of the sub-reset drivers may include stages that respectively generate a corresponding reset signal while sequentially shifting a corresponding start signal among the start signals based on the clock signals.

According to some example embodiments, the scan driver may include sub-scan drivers respectively corresponding to the unit blocks, wherein each of the sub-scan drivers may provide corresponding scan signals among the scan signals to a corresponding unit block among the unit blocks.

According to some example embodiments, a sensing period may include a first period, a second period, and a third period that are classified based on a cycle change of the dock signals, and in the first period: the controller may simultaneously (or concurrently) generate the start signals having a pulse of turn-on voltage level; the selector may provide the start signals and the clock signals to the first control lines; and the sub-reset drivers may simultaneously (or concurrently) output at least some of the reset signals in response to the start signals.

According to some example embodiments, in the first period, the controller may generate start signals, wherein each of the start signals may have a plurality of pulses of turn-on voltage level.

According to some example embodiments, in the second period, the controller may sequentially generate some of the start signals; and in the second period, the selector may provide the some of the start signals and the clock signals to the first control lines.

According to some example embodiments, the controller may set a cycle of the dock signals in the second period to be greater than that of the clock signals in the first period.

According to some example embodiments, the input sensing device may further include a multiplexer that is connected between k read-out lines (where k is an integer of 2 or more) among the read-out lines and an output line, and that sequentially connects the k read-out lines to the output line.

According to some example embodiments, in the third period, the selector may provide the start signals and the clock signals to the second control lines.

According to some example embodiments, the clock signals may include a first clock signal and a second clock signal; the third period may include a first sub-period and a second sub-period that are sequentially repeated; in the first sub-period, the controller may generate the first dock signal having pulses of turn-on voltage level and may maintain the second clock signal at a turn-off voltage level; and in the second sub-period, the controller may generate the second dock signal having pulses of turn-on voltage level and may maintain the first clock signal at a turn-off voltage level.

According to some example embodiments, the number of pulses of turn-on voltage level in the first sub-period may be the k.

According to some example embodiments, a repetition cycle of the first sub-period and the second sub-period may be the same as a cycle of the clock signals in the second period.

According to some example embodiments, each of the sensor pixels may include a photo diode; a first transistor including a first electrode connected to a first power line, a second electrode, and a gate electrode connected to one electrode of the photo diode; a second transistor including a first electrode connected to the second electrode of the first transistor, a second electrode connected to a corresponding read-out line among the read-out lines, and a gate electrode connected to a corresponding scan line among the scan lines; a third transistor including a first electrode connected to a second power line, a second electrode connected to the gate electrode of the first transistor, and a gate electrode connected to a corresponding reset line among the reset lines; and a capacitor connected to the photo diode in parallel.

According to some example embodiments of the present invention provides a display device including: a display panel displaying an image; and an input sensing device located on one surface of the display panel. The input sensing device may include a reset lines; scan lines; read-out lines; sensor pixels that are connected to the reset lines, the scan lines, and the read-out lines, wherein each of the sensor pixels is initialized in response to a reset signal provided through a corresponding reset line among the reset lines, senses light that is emitted from the display panel and reflected by a target object to generate a sensing signal, and outputs the sensing signal to a corresponding read-out line among the read-out lines in response to a scan signal provided through a corresponding scan line among the scan lines; a controller that generates at least one start signal and clock signals; a selector that selectively provides the at least one start signal and the clock signals to first control lines or second control lines; a reset driver that is connected to the first control lines and supplies reset signals to at least some of the reset lines based on the at least one start signal and the clock signals provided through the first control lines; and a scan driver that is connected to the second control lines and supplies scan signals to at least some of the scan lines based on the at least one start signal and the dock signals provided through the second control lines.

According to some example embodiments, the display panel may emit light in an area contacted by a target object based on touch position information provided from the outside; and the input sensing device may be locally driven corresponding to the area contacted by the target object.

According to some example embodiments, each of the sensor pixels may be divided into a plurality of unit blocks including at least one sensor pixel; the reset driver may correspond to each of the unit blocks and include sub-reset drivers, wherein each of the sub-reset drivers may provide corresponding reset signals among the reset signals to a corresponding unit block among the unit blocks; and the controller may generate start signals corresponding to each of the sub-reset drivers.

According to some example embodiments, a sensing period may include a first period, a second period, and a third period that are classified based on a cycle change of the dock signals, and in the first period: the controller may simultaneously (or concurrently) generate the start signals having a pulse of turn-on voltage level; the selector may provide the start signals and the dock signals to the first control lines; and the sub-reset drivers may simultaneously (or concurrently) output at least some of the reset signals in response to the start signals.

According to some example embodiments, in the second period, the controller may sequentially generate some of the start signals; and in the second period, the selector may provide the some of the start signals and the dock signals to the first control lines.

According to some example embodiments, the input sensing device and the display device including the same according to the embodiments of the present invention may selectively provide start signals and dock signals to a reset driver or scan driver by using a selector. Accordingly, the number of channels/pads/signal lines of the input detector for outputting or transmitting the start signals and dock signals may be reduced, and an area and manufacturing cost of the input detector may be reduced.

According to some example embodiments, in addition, the input sensing device and the display device may further include a multiplexer that is located between sensor pixels and an input detector to sequentially provide sensing signals of the sensor pixels to the input detector, and a scan signal having a plurality of pulses may be provided to one scan line in response to a point in time when switches in the multiplexer are respectively operated. Therefore, it may be possible to prevent or reduce instances of noise being introduced into the sensing signals of the sensor pixels by turn-on/off of the switches in the multiplexer, and to improve accuracy of fingerprint sensing.

However, embodiments according to the present invention are not limited to the above-described characteristics, and may be variously extended without departing from the spirit and scope of embodiments according to the present invention.

DETAILED DESCRIPTION

Figure 1A:
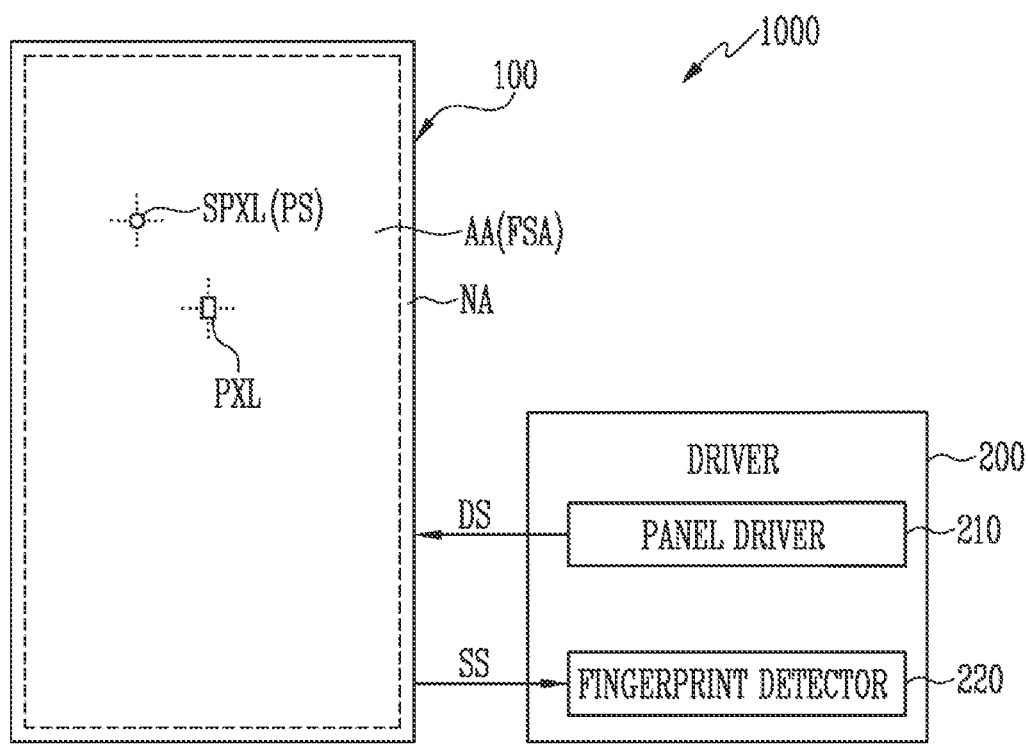
FIG. 1A is a block diagram of a display device according to some example embodiments of the present invention.

Aspects of some example embodiments of the present invention will be described more fully hereinafter with reference to the accompanying drawings, in which embodiments of the invention are shown. As those skilled in the art would realize, the described embodiment may be modified in various different ways, all without departing from the spirit or scope of embodiments according to the present disclosure.

In order to more clearly describe aspects of embodiments according to the present invention, description of elements or components that is not necessary to enable a person having ordinary skill in the art to understand the invention may be omitted, and identical or similar constituent elements throughout the specification are denoted by the same reference numerals. Therefore, the above-mentioned reference numerals may be used in other drawings.

Further, in the drawings, the size and thickness of each element are arbitrarily illustrated for ease of description, and embodiments according to the present disclosure are not necessarily limited to those illustrated in the drawings. In the drawings, the thicknesses of layers, films, panels, regions, etc. may be exaggerated for clarity.

FIG. 1A is a block diagram of a display device according to some example embodiments of the present invention.

Figure 1B:
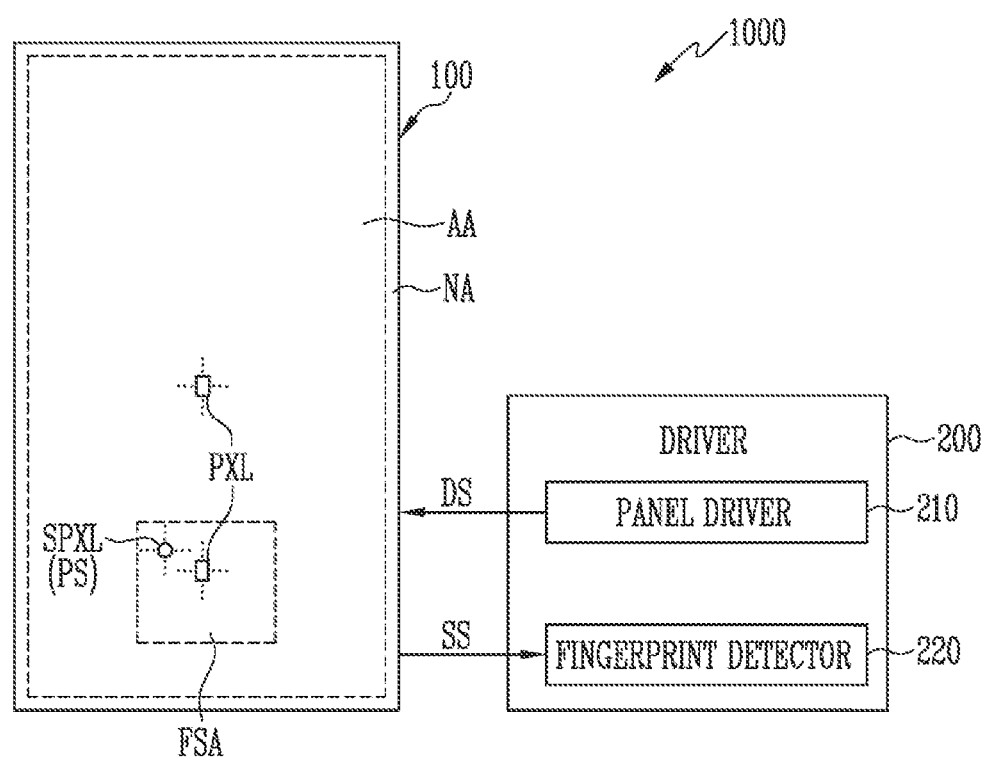
FIG. 1B is a block diagram of a display device according to some example embodiments of the present invention.

FIG. 1B is a block diagram illustrating further details of a display device according to some example embodiments of the present invention.

For convenience, FIG. 1A and FIG. 1B illustrate that a display panel 100 and a driver 200 are separated, but embodiments according to the present invention are not limited thereto. For example, all or a portion of the driver 200 may be integrally implemented into a component (e.g., a single component) on the display panel 100.

Referring to FIG. 1A and FIG. 1B, a display device 1000 may include the display panel 100 and the driver 200. The driver 200 may include a panel driver 210 and a fingerprint detector 220 (or an input detector).

All or at least a portion of the display device 1000 may be flexible.

The display panel 100 includes a display area AA and a non-display area NA. The display area AA is an area in which a plurality of pixels PXL (which may be referred to as subpixels) are provided, and may be referred to as an active area. According to some example embodiments, each of the pixels PXL may include at least one light emitting element. The display device 1000 displays an image in the display area AA by driving the pixels PXL in response to image data inputted from the outside (e.g., from an external data source).

According to some example embodiments, the display area AA may include a fingerprint sensing area FSA. The fingerprint sensing area FSA may include at least some of the pixels PXL provided in the display area AA.

According to some example embodiments, as shown in FIG. 1A, all of the display area AA may be set as the fingerprint sensing area FSA. In this case, when fingerprint sensing is performed, a fingerprint sensing operation may be performed only in a portion that is substantially touched by a user.

According to some example embodiments, as shown in FIG. 1B, at least a portion of the display area AA may be set as the fingerprint sensing area FSA.

Meanwhile, FIG. 1B illustrates an example in which only one fingerprint sensing area FSA is formed in the display area AA, but embodiments according to the present invention are not limited thereto. For example, a plurality of fingerprint sensing areas FSA may be regularly (e.g., in a preset or predetermined pattern) or irregularly arranged in the display area AA.

In addition, FIG. 1A and FIG. 1B illustrates an example in which the fingerprint sensing area FSA is formed in at least a portion of the display area AA, but embodiments according to the present invention are not limited thereto. That is, according to some example embodiments, the display area AA and the fingerprint sensing area FSA may be provided to overlap each other in only at least portions thereof.

The non-display area NA is an area arranged around the display area AA, and may be referred to as a non-active area. For example, the non-display area NA may include a wire area, a pad area, and various dummy areas.

According to some example embodiments, the display device 1000 may further include a plurality of sensor pixels SPXL provided in the fingerprint sensing area FSA. The sensor pixels SPXL may be configured of a photo sensor PS for sensing light. According to some example embodiments, the sensor pixels SPXL may output a corresponding electrical signal (for example, a voltage signal) by sensing a reflected light when light emitted from a light source (or pixel PXL) provided in the display device 1000 is reflected by a user's finger. The electrical signal may be transmitted to the driver 200 (for example, the fingerprint detector 220) to be used for fingerprint sensing. Hereinafter, although embodiments according to the present invention are described with respect to the sensor pixels SPXL being used for fingerprint sensing as an example, the sensor pixels SPXL may be used for performing various functions as in a touch sensor or a scanner.

When the sensor pixels SPXL are located in the fingerprint sensing area FSA in a plan view, the sensor pixels SPXL may overlap the pixels PXL or may be arranged around the pixels PXL. For example, some or all of the sensor pixels SPXL may overlap the pixels PXL or may be located between the pixels PXL. According to some example embodiments, the sensor pixels SPXL and the pixels PXL may have the same or different sizes. A relative size and arrangement between sensor pixels SPLX and the pixels PXL are not particularly limited.

When the sensor pixels SPXL are arranged adjacent to the pixels PXL or overlap at least a portion thereof, the sensor pixels SPXL may use a light emitting element provided in the pixel PXL as a light source. According to some example embodiments, the sensor pixels SPXL may configure a photo-sensing type fingerprint sensor (or photo sensor PS) together with the light emitting elements provided in the pixels PXL. As such, when a fingerprint sensor-embedded display device is configured using the pixels PXL as light sources without a separate external light source, a module thickness of the fingerprint sensor of a photo-sensing type and the display device having the same may be reduced, and a manufacturing cost may be reduced.

According to some example embodiments, the sensor pixels SPXL may be arranged on another surface (for example, a rear surface) opposite to a surface (for example, a front surface) on which an image is displayed among opposite surfaces of the display panel 100. However, embodiments according to the present invention are not limited thereto.

The driver 200 may drive the display panel 100. For example, the driver 200 may output a data signal DS corresponding to image data to the display panel 100. In addition, the driver 200 may output a driving signal for the sensor pixel SPXL, and receive electrical signals (for example, sensing signal SS) from the sensor pixels SPXL. The driver 200 may detect a user's fingerprint type by using the electrical signals, and may detect a counterfeit fingerprint.

According to some example embodiments, the driver 200 may include the panel driver 210 and the fingerprint detector 220. For convenience, FIG. 1A and FIG. 1B illustrate that the panel driver 210 and the fingerprint detector 220 are separated, but embodiments according to the present invention are not limited thereto. For example, at least a portion of the fingerprint detector 220 may be integrated with the panel driver 210, or may operate in conjunction with the panel driver 210.

The panel driver 210 may supply the data signal DS corresponding to image data to the pixels PXL while sequentially scanning the pixels PXL of the display area AA. Thus, the display panel 100 may display an image corresponding to the image data.

According to some example embodiments, the panel driver 210 may supply a driving signal for fingerprint sensing to the pixels PXL. The driving signal may be provided so that the pixels PXL emit light and operate as a light source for the sensor pixels SPXL. According to some example embodiments, the driving signal for fingerprint sensing may be provided to the pixels PXL provided in a specific area in the display panel 100 (for example, the pixels PXL provided in the fingerprint sensing area FSA, or the pixels PXL corresponding to a portion at which a user's touch occurs).

According to some example embodiments, a driving signal for fingerprint sensing may be provided by the fingerprint detector 220.

The fingerprint detector 220 may transmit a driving signal (for example, a driving voltage) for driving the sensor pixels SPXL to the sensor pixels SPXL, and may detect a user fingerprint based on electrical signals received from the sensor pixels SPXL. For example, the fingerprint detector 220 may perform fingerprint authentication based on the sensing signal SS supplied from the sensor pixels SPXL (for example, photo sensors). The pixels sensor SPXL (or photo sensor PS) and the fingerprint detector 220 may configure an input sensing device FDD (or a fingerprint sensing device, a fingerprint sensor).

As described above, the display device 1000 includes the input sensing device FDD, and the input sensing device FDD may include the photo sensor PS and the fingerprint detector 220 located on one surface of the display panel 100, and it may use the pixel PXL provided in the display panel 100 as a light source.

Figure 2A:
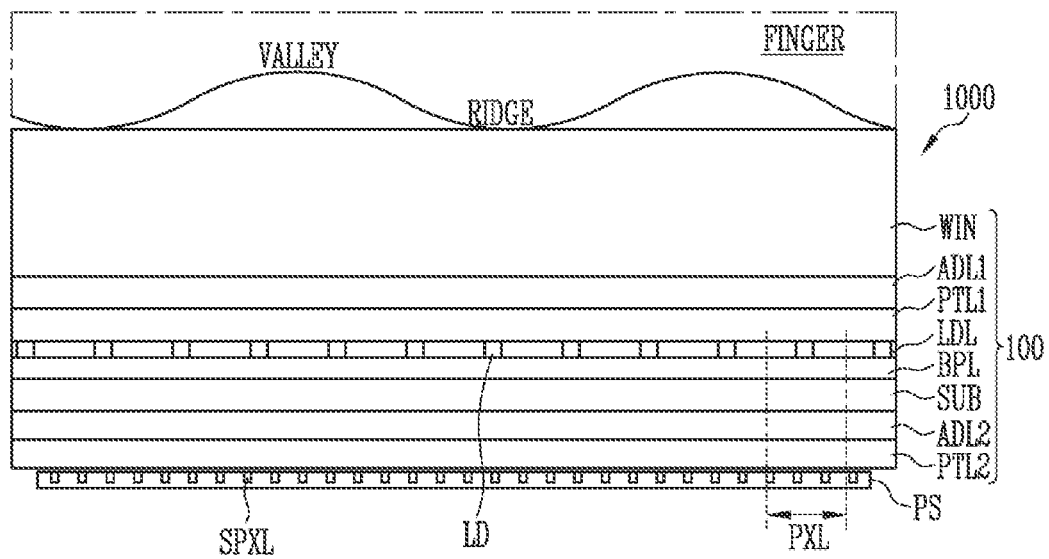
FIG. 2A is a cross-sectional view of an example of the display device of FIG. 1A according to some example embodiments of the present invention.

FIG. 2A illustrates a cross-sectional view of an example of the display device of FIG. 1A. For example, FIG. 2A illustrates an example of a cross-section in the fingerprint sensing area FSA of the display device 1000 shown in FIG. 1A and FIG. 1B.

Referring to FIG. 1A to FIG. 2A, the display device 1000 may include the display panel 100 in the fingerprint sensing area FSA and the photo sensor PS located on one surface of the display panel 100. In addition, the display device 1000 may include a substrate SUB, and a circuit element layer BPL, a light emitting element layer LDL, a first passivation layer PTL1, a first adhesive layer ADL1, and a window WIN that are sequentially arranged on one surface (for example, an upper surface) of the substrate SUB. In addition, the display device 1000 may include a second adhesive layer ADL2 and a second passivation layer PTL2 that are sequentially arranged on the other surface (for example, a lower surface) of the substrate SUB in the sensing area SA.

The substrate SUB is a base substrate for the display panel 100, and may be a substantially transparent transmissive substrate. The substrate SUB may be a rigid substrate including glass or tempered glass, or a flexible substrate made of plastic material. However, the material of the substrate SUB is limited not thereto, and the substrate SUB may be made of various materials.

The circuit element layer BPL may be located on one surface of the substrate SUB, and may include at least one conductive layer. For example, the circuit element layer BPL may include a plurality of circuit elements forming a pixel circuit of the pixels PXL, and wires for supplying various power sources and signals for driving the pixels PXL. In this case, the circuit element layer BPL may include various circuit elements such as at least one transistor and capacitor, and a plurality of conductive layers for forming wires connected to the various circuit elements. In addition, the circuit element layer BPL may include at least one insulation layer provided between the plurality of conductive layers.

The light emitting element layer LDL may be located on one surface of the circuit element layer BPL. The light emitting element layer LDL may include a plurality of light emitting elements LD connected to circuit elements and/or wires of the circuit element layer BPL through a contact hole or the like. According to some example embodiments, at least one of the plurality of light emitting elements LD may be provided for each pixel PXL. For example, the light emitting element LD may be configured of an organic light emitting diode or an inorganic light emitting diode such as a micro light emitting diode and a quantum dot light emitting diode. In addition, the light emitting element LD may be a light emitting element complexly made of organic and inorganic materials. Further, each pixel PXL may include a single light emitting element, but according to some example embodiments, each pixel PXL may include a plurality of light emitting elements, and the plurality of light emitting elements may be connected in series, parallel, or in series and parallel to each other.

Each of the pixels PXL may include circuit elements located on the circuit element layer BPL and at least one light emitting element LD located on the light emitting element layer LDL on the circuit element layer BPL.

The first passivation layer PTL1 may be located on the light emitting element layer LDL to cover the display area AA. The first passivation layer PTL1 may include a sealing member such as a thin film encapsulation (TFE) layer or encapsulation substrate, and may additionally include a passivation film in addition to the sealing member.

The first adhesive layer ADL1 is located between the first passivation layer PTL1 and the window WIN to combine the first passivation layer PTL1 and the window WIN. The first adhesive layer ADL1 may include a transparent adhesive such as an optically clear adhesive (OCA), and may include various adhesive materials.

The window WIN may be a protective member located at an uppermost portion of a module of the display device 1000 including the display panel 100, and may be a substantially transparent transmissive substrate. The window WIN may have a multi-layered structure selected from a glass substrate, a plastic film, and a plastic substrate. The window WIN may include a rigid or flexible substrate, and the material included in the window WIN is not particularly limited.

According to some example embodiments, the display device 1000 may further include a polarizing plate, an anti-reflection layer, and/or a touch sensor layer (touch electrode layer). For example, the display device 1000 may further include a polarizing plate and/or touch sensor layer located between the first passivation layer PTL1 and the window WIN.

The touch sensor layer may include a plurality of sensing electrodes (or sensing cells). In this case, the driver 200 described with reference to FIG. 1A may sense the presence or absence of a touch input and a position (or coordinates) of the touch input based on a change in capacitance between the sensing electrodes.

The second passivation layer PTL2 may be located on the other surface of the substrate SUB. The second passivation layer PTL2 may be bonded to the substrate SUB by the second adhesive layer ADL2.

The second adhesive layer ADL2 may firmly bond (or attach) the substrate SUB and the second passivation layer PTL2. The second adhesive layer ADL2 may include a transparent adhesive such as OCA. The second adhesive layer ADL2 may include a pressure sensitive adhesive (PSA) that acts as an adhesive material when pressure to adhere to an adhesive surface is applied thereto.

The second passivation layer PTL2 blocks oxygen and moisture from being introduced from the outside, and may be formed as a single layer or multilayer. The second passivation layer PTL2 may be formed in a film form to further secure flexibility of the display panel 100. The second passivation layer PTL2 may be combined with the photo sensor PS through another adhesive layer including a transparent adhesive such as OCA.

The photo sensor PS is attached to a back side (for example, rear side) of the display panel 100 through an adhesive or the like so as to overlap at least one area of the display panel 100. For example, the photo sensor PS may be arranged to overlap the display panel 100 in the fingerprint sensing area FSA. The photo sensor PS may include a plurality of sensor pixels SPXL dispersed at a predetermined resolution and/or interval.

According to some example embodiments, an optical system providing a light path by condensing light directed to the photo sensor PS may be provided on the photo sensor PS. A width of a light transmitting portion that guides light in the optical system may be determined in consideration of sensing precision and light conversion efficiency. A condensing rate of light incident on the photo sensor PS may be improved by the optical system. According to some example embodiments, the optical system may be formed of an optical fiber, silicon, and the like.

The sensor pixels SPXL may have an appropriate number, size, and arrangement so that an identifiable fingerprint image may be generated from electrical signals outputted by the sensor pixels SPXL. Intervals between the sensor pixels SPXL may be densely set so that light reflected from a target object (for example, fingerprint) may be incident on at least two adjacent sensor pixels SPXL.

The sensor pixels SPXL may sense external light to output a corresponding electrical signal, for example, a voltage signal. The reflected light received by respective sensor pixels SPXL may have optical characteristics (for example, frequency, wavelength, size, etc.) due to valleys and ridges of a fingerprint formed on a user's finger (or, a palm pattern and a dermatoglyphic pattern formed on a palm and a skin). Accordingly, each of the sensor pixels SPXL may output the sensing signal SS having different electrical characteristics corresponding to the optical characteristics of the reflected light.

According to some example embodiments, the sensing signal SS outputted by the sensor pixels SPXL may be converted into image data by the fingerprint detector 220 to be used for user's fingerprint identification (that is, fingerprint authentication).

Figure 2B:
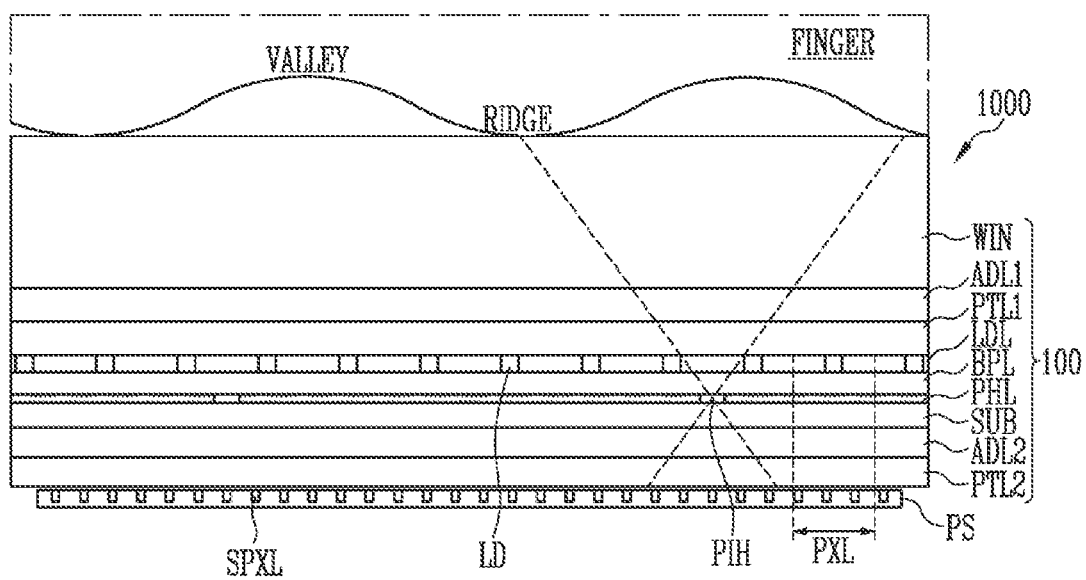
FIG. 2B is a cross-sectional view of an example of the display device of FIG. 1A according to some example embodiments of the present invention.

FIG. 2B illustrates a cross-sectional view of an example of the display device of FIG. 1A. For example, FIG. 2B illustrates an example of a cross-section in the fingerprint sensing area FSA of the display device 1000 shown in FIG. 1A and FIG. 1B Referring to FIG. 1A, FIG. 2A, and FIG. 2B, FIG. 2B illustrates an example of embodiments that utilize a light blocking layer PHL including pinholes PIH as an optical system. The light blocking layer PHL may be located within the display panel 100 or between the display panel 100 and the sensor pixels SPXL to block a portion of light incident to the sensor pixels SPXL. For example, a portion of the light incident on the light blocking layer PHL may be blocked, and the remaining portion thereof may pass through the pinholes PIH to reach sensor pixels SPXL under the light blocking layer PHL. The pinholes PIH may operate as an optical system, and may be used together with other optical systems.

The pinhole PIH may mean an optical hole, and may be a kind of light-transmitting hole. For example, the pinholes PIH may be light-transmitting holes having the smallest size (or area) among light-transmitting holes in which layers of the display device 1000 overlap each other, on a path that the reflected light passes through the display panel 100 in a diagonal or vertical direction to be incident on the sensor pixels SPXL.

The pinholes PIH may have a predetermined width, for example, a width having a range of 5 µm to 20 µm. In this way, as it moves away from the light blocking layer PHL (that is, as it moves in an upper or lower direction of the light blocking layer PHL), a width of an optical opening area to be secured in each layer of the display device 1000 may gradually increase.

A width (or diameter) of the pinholes PIH may be set to be approximately 10 times or more of a wavelength of the reflected light, for example, to be approximately 4 µm or 5 µm or more to prevent or reduce light diffraction. In addition, the width of the pinholes PIH may be set to a size sufficient to prevent or reduce image blur and to sense a shape of a fingerprint more clearly. For example, the width of the pinholes PIH may be set to approximately 15 µm or less. However, embodiments according to the present invention are not limited thereto, and the width of the pinholes PIH may vary depending on a wavelength band of reflected light and/or a thickness of each layer of a module.

Only reflected light passing through the pinholes PIH may reach the sensor pixels SPXL of the photo sensor PS. A phase of light reflected from the fingerprint by the pinhole PIH having a very narrow width and a phase of an image formed on the photo sensor PS may have a difference of 180 degrees.

The sensor pixels SPXL may output the sensing signal SS corresponding to the received reflected light, for example, a voltage signal.

According to some example embodiments, an infrared blocking filter may be further located between an optical system (for example, the light blocking layer PHL) and the photo sensor PS, or between the display panel 100 and the optical system.

However, this is merely an example, and the configuration, arrangement, and driving method of the photo sensor for detecting the reflected light from a fingerprint is not limited to the photo sensor PS of FIG. 2A or FIG. 2B.

Meanwhile, the pinhole type photo sensor is illustrated in FIG. 2B, but embodiments according to the present invention are not limited thereto, and for example, a micro lens type or collimator type photo sensor may be used.

Figure 3:
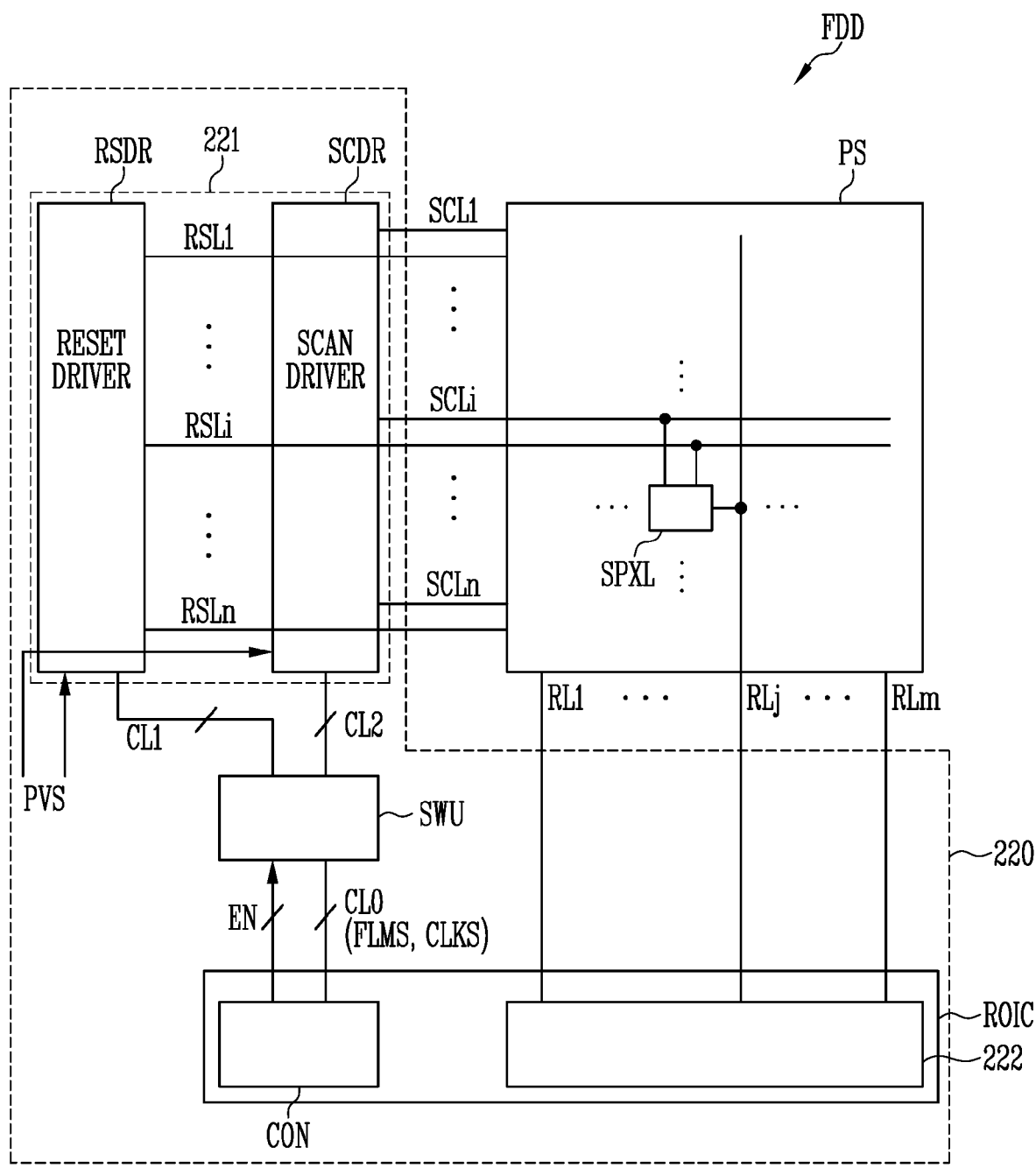
FIG. 3 is a block diagram of an example of an input sensing device included in the display device of FIG. 1A according to some example embodiments of the present invention.

FIG. 3 illustrates a block diagram of an example of an input sensing device included in the display device of FIG. 1A. For example, FIG. 3 illustrates an example of the input sensing device FDD included in the display device 1000 of FIG. 1A and FIG. 1B.

Referring to FIG. 1A to FIG. 3, the input sensing device FDD may include the photo sensor PS and the fingerprint detector 220.

The photo sensor PS may include an array of sensor pixels SPXL. According to some example embodiments, the sensor pixels SPXL may be arranged in a two-dimensional array, but embodiments according to the present invention are not limited thereto. Each sensor pixel SPXL may include a photoelectric device that photoelectrically converts incident light into a charge according to an amount of the light.

The fingerprint detector 220 may include a horizontal driver 221, a vertical driver 222, a controller CON, and a selector SWU. The horizontal driver 221 and the selector SWU may be formed together with the photo sensor PS on one substrate, and the vertical driver 222 and the controller CON may be implemented as an integrated circuit (for example, an input detection circuit ROIC) and may be connected to the photo sensor PS and the like through a flexible circuit board. However, embodiments according to the present invention are not limited thereto.

The horizontal driver 221 may include a reset driver RSDR and a scan driver SCDR. The reset driver RSDR and the scan driver SCDR are connected to power lines PVS, and power voltages (for example, a first power voltage having a turn-on voltage level that turns on an internal transistor, a second power voltage having a turn-off voltage level that turns off the internal transistor, and a ground voltage) required for driving each of the reset driver RSDR and the scan driver SCDR may be applied to the power lines PVS.

The reset driver RSDR may be connected to the sensor pixels SPXL through reset lines RSL1 to RSLn (n is a positive integer). The reset driver RSDR may be configured with a shift register or an address decoder. According to some example embodiments, the reset driver RSDR may apply a reset signal to at least some of the sensor pixel SPXL in order to initialize the sensor pixels SPXL (for example, to initialize or discharge a photoelectric converted charge charged in the sensor pixels SPXL).

According to some example embodiments, the reset driver RSDR is connected to first control lines CL1, and it may supply reset signals to at least some of the reset lines RSL1 to RSLn based on at least one start signal FLMS and clock signals CLKS provided through the first control lines CL1. Here, at least one start signal FLMS and the clock signals CLKS may be provided to the reset driver RSDR through the selector SWU from the controller CON. According to some example embodiments, the reset driver RSDR may sequentially output the reset signals in sensor pixel row units. However, the reset driver RSDR is not limited thereto, and according to some example embodiments, the reset driver RSDR may simultaneously (or concurrently) output at least some of the reset signals to the sensor pixels SPXL.

A more detailed configuration and operation of the reset driver RSDR will be described later with reference to FIG. 7 to FIG. 9.

The scan driver SCDR may be connected to the sensor pixels SPXL through scan lines SCL1 to SCLn. The scan driver SCDR may be configured with a shift register or an address decoder. According to some example embodiments, the scan driver SCDR may apply a scan signal to some selected from the sensor pixels SPXL to drive the sensor pixel SPXL. The scan driver SCDR may apply the scan signal in sensor pixel row units.

According to some example embodiments, the scan driver SCDR is connected to second control lines CL2, and it may supply scan signals to at least some of the scan lines SCL1 to SCLn based on at least one start signal FLMS and the clock signals CLKS provided through the second control lines CL2. Here, at least one start signal FLMS and the clock signals CLKS may be provided to the scan driver SCDR through the selector SWU from the controller CON.

A more detailed configuration and operation of the scan driver SCDR will be described later with reference to FIG. 7 to FIG. 9.

The sensor pixels SPXL selected and driven by the scan driver SCDR sense light by using photoelectric elements provided in the sensor pixels SPXL, and output an electrical signal (sensing signal SS) corresponding to the sensed light, for example, an analog type voltage signal. For example, when the sensor pixel SPXL is connected to an i-th reset line RSLi (where i is a positive integer less than or equal to n) and an i-th scan line SCLi, the sensor pixel SPXL may be initialized in response to a reset signal provided through the i-th reset line RSLi (for example, a charge generated by the photoelectric element may be initialized), and it may output an electrical signal (for example, an electrical signal generated by a photoelectric element after applying a reset signal and before applying a scan signal) in response to a scan signal provided through the i-th scan line SCLi.

A more specific configuration and operation of the sensor pixel SPXL will be described later with reference to FIG. 4.

The vertical driver 222 may be connected to sensor pixels SPXL through read-out lines RL1 to RLm (where m is a positive integer). As shown in FIG. 3, when the sensor pixel SPXL is connected to a j-th read-out line RLj (where j is a positive integer less than or equal to m), the vertical driver 222 may receive an electrical signal outputted from the sensor pixel SPXL through the j-th read-out line RLj.

The vertical driver 222 may process the signal outputted from sensor pixels SPXL. For example, the vertical driver 222 may perform correlated double sampling (CDS) processing to remove noise from the received electrical signal. In addition, the vertical driver 222 may convert an analog signal received from the sensor pixels SPXL into a digital signal. According to some example embodiments, an analog-digital converter is provided for each sensor pixel array, so that analog signals received from the sensor pixel array may be processed in parallel.

The controller CON may control the horizontal driver 221 and the vertical driver 222.

According to some example embodiments, the controller CON may generate at least one start signal FLMS and the dock signals CLKS. According to some example embodiments, the controller CON may generate at least one start signal FLMS (for example, reset start signal) and the clock signals CLKS (for example, reset clock signals) for the reset driver RSDR in a first period, and generate at least one start signal FLMS (for example, scan start signal) and the clock signals CLKS (for example, scan clock signal) for the scan driver SCDR in a second period different from the first period.

According to some example embodiments, the controller CON may generate image data corresponding to the sensing signal SS received from the vertical driver 222, and may process the generated image data. In addition, according to some example embodiments, the controller CON may detect a fingerprint from the processed image data, or transmit the detected fingerprint to the authentication and/or outside. However, this is merely an example, and image data generation and fingerprint detection are not performed by the controller CON, but may be performed by an external host processor.

The selector SWU may selectively provide at least one start signal FLMS and the dock signals CLKS generated by the controller CON to the first control lines CL1 or second control lines CL2. As shown in FIG. 3, the selector SWU may receive at least one start signal FLMS and the dock signals CLKS through reference control lines CL0, and provide at least one start signal FLMS and the dock signals CLKS to the reset driver RSDR or to the scan driver SCDR in response to an enable signal EN.

As will be described with reference to FIG. 3 and FIG. 6, in order to allocate a sufficient sensing time to the sensor pixels SPXL in connection with a large area of the photo sensor PS, the horizontal driver 221 may divide the photo sensor PS into a plurality of unit blocks to locally drive only some of the plurality of unit blocks. For example, the photo sensor PS may target one sensor pixel array to divide it into 40 unit blocks. In order to independently supply a reset signal and a scan signal from other unit blocks to one unit block, one start signal (for example, reset start signal) for the reset driver RSDR and another one start signal (for example, scan start signal) for the scan driver SCDR may be required. In order to separately supply the reset signal and scan signal to each of the 40 unit blocks, 80 start signals (for example, 40 reset start signals and 40 scan start signals) may be required. That is, the number of output channels of the controller CON may be increased, and the number of reference control lines CL0 (and pads) may be increased correspondingly.

Therefore, the input sensing device FDD sequentially generate at least one start signal FLMS (for example, 40 reset start signals) for the reset driver RSDR and at least one start signal FLMS (for example, 40 scan start signals) for the scan driver SCDR through the controller CON, and may selectively provide at least one start signal FLMS (for example, 40 reset start signals or 40 scan start signals) to the reset driver RSDR and the scan driver SCDR by using the selector SWU. Therefore, the number of output channels (and pads) of the controller CON for transmitting at least one start signal FLMS may be reduced to about half levels (for example, 80 channels may be reduced to 40 channels), and an area and manufacturing costs of the controller CON (and the input detection circuit ROIC) may be reduced.

As described with reference to FIG. 3, the input sensing device FDD may selectively provide at least one start signal FLMS and the clock signals CLKS to the reset driver RSDR and the scan driver SCDR by using the selector SWU. Therefore, the number of output channels (and pads) of the controller CON for transmitting at least one start signal FLMS and the clock signals CLKS may be reduced, and an area and manufacturing costs of the controller CON (and input detection circuit ROIC) may be reduced.

Figure 4:
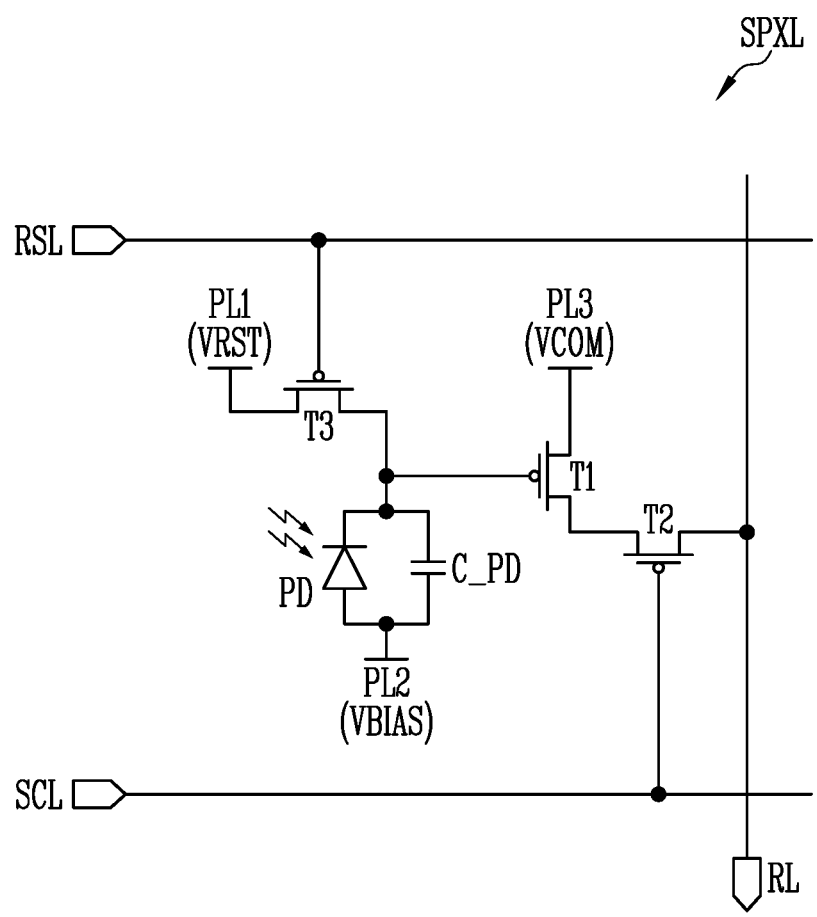
FIG. 4 is a circuit diagram of an example of a sensor pixel included in the input sensing device of FIG. 3 according to some example embodiments of the present invention.

FIG. 4 illustrates a circuit diagram of an example of a sensor pixel included in the input sensing device of FIG. 3. A reset line RSL may be one of the reset lines RSL1 to RSLn, a scan line SCL may be one of the scan lines SCL1 to SCLn, and a read-out line RL may be one of the read-out lines RL1 to RLm.

Referring to FIG. 3 and FIG. 4, the sensor pixel SPXL may include a first transistor T1, a second transistor T2, a third transistor T3, a photo diode PD, and a capacitor C_PD. FIG. 4 illustrates an example in which the transistors T1, T2, and T3 are P-type transistors, but according to some example embodiments, at least some of the transistors may be an N-type transistor, and correspondingly, a circuit structure of the sensor pixel SPXL may be variously modified.

An anode of the photo diode PD may be connected to a second power line PL2, and a cathode of the photo diode PD may be connected to a gate electrode of the first transistor T1. A bias voltage VBIAS for driving the photo diode PD may be applied to the second power line PL2.

The capacitor C_PD is formed between the gate electrode of the first transistor T1 and the second power line PL2, and may be connected in parallel to the photo diode PD. The capacitor C_PD may store a charge photoelectrically converted by the photo diode PD.

A first electrode of the third transistor T3 may be connected to a first power line PL1, a second electrode of the third transistor T3 may be connected to the gate electrode of the first transistor T1, and a gate electrode of the third transistor T3 may be connected to the reset line RSL. Here, a reset voltage VRST may be applied to the first power line PL1. The third transistor T3 may electrically connect the first power line PL1 and the gate electrode of the first transistor T1 in response to a reset signal applied to the reset line RSL. In this case, a voltage applied to the gate electrode of the first transistor T1 (or a voltage stored in the capacitor C_PD) may be initialized or reset by the reset voltage VRST.

A first electrode of the first transistor T1 may be connected to a third power line PL3, a second electrode of the first transistor T1 may be connected to a first electrode of the second transistor T2, and the gate electrode of the first transistor T1 may be connected to the cathode of the photo diode PD. A common voltage VCOM may be applied to the third power line PL3. The first transistor T1 may control an amount of current flowing from the third power line PL3 to the second transistor T2 in response to a voltage stored in the capacitor C_PD (that is, a charge photoelectrically converted by the photo diode PD). The first transistor T1 may operate as an amplifier that amplifies and outputs a voltage stored in the capacitor C_PD.

The first electrode of the second transistor T2 may be connected to the second electrode of the first transistor T1, a second electrode of the second transistor T2 may be connected to a read-out line RL, and a gate electrode of the second transistor T2 may be connected to a scan line SCL. The second transistor T2 may form a current flowing path between the first transistor T1 (or third power line PL3) and the read-out line RL in response to a scan signal applied to the scan line SCL. For example, the second transistor T2 may be turned on in response to a scan signal of a turn-on voltage level, and the second electrode of the first transistor T1 may be electrically connected to the read-out line RL. In this case, during a time from a point of time when a reset signal is applied to the reset line RSL to a point of time when a scan signal is applied to the scan line SCL, an electrical signal corresponding to a voltage (that is, a voltage corresponding to a charge photoelectrically converted in the photo diode PD) stored in the capacitor C_CP may be outputted to the outside (for example, the vertical driver 222, see FIG. 3) through the read-out line RL.

According to some example embodiments, the structure of the sensor pixel SPXL is not limited to that described above, and the sensor pixel SPXL may include, for example, 4 or more or 2 or less transistors.

Figure 5A:
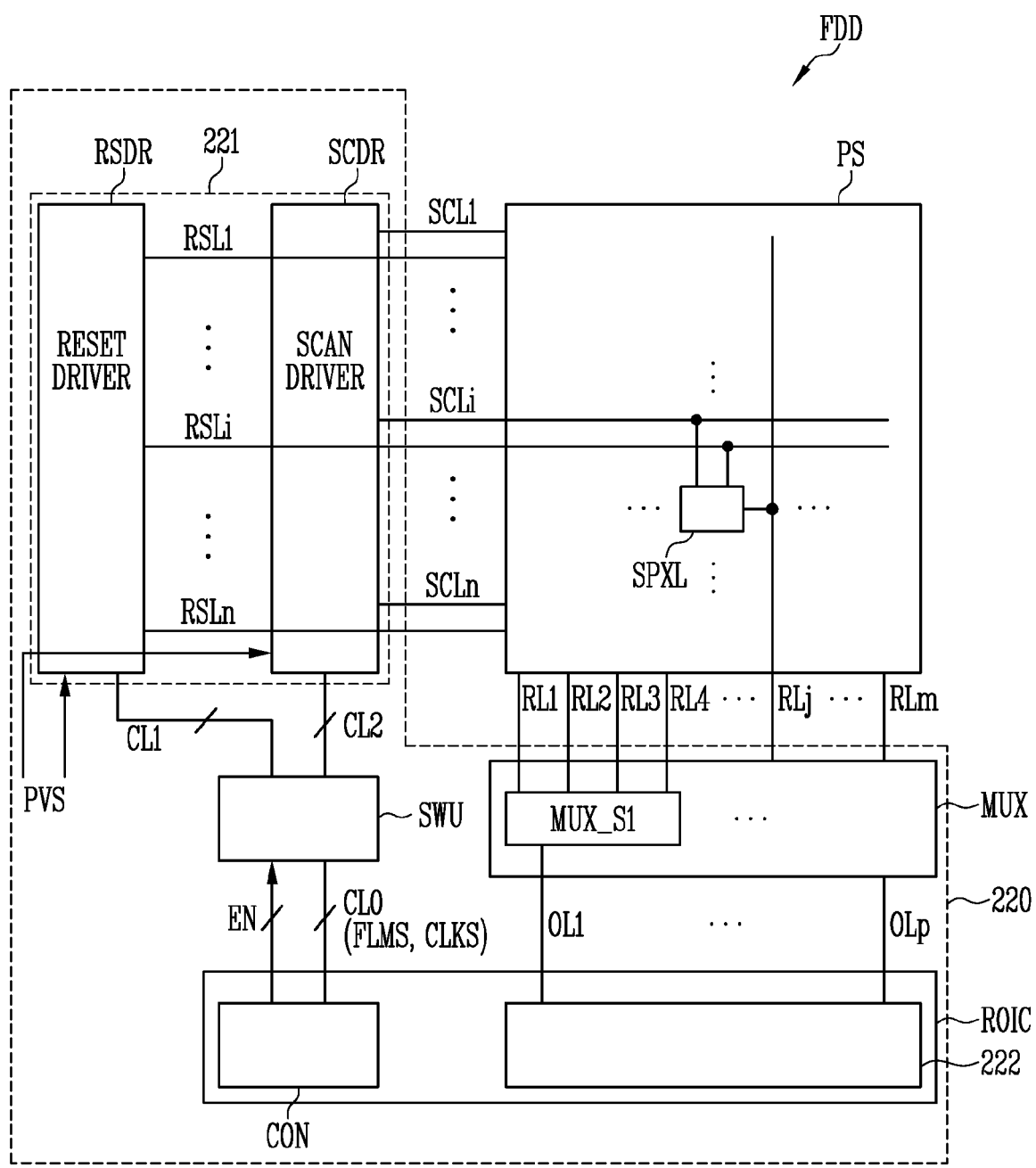
FIG. 5A is a block diagram of the input sensing device of FIG. 3 according to some example embodiments of the present invention.
Figure 5B:
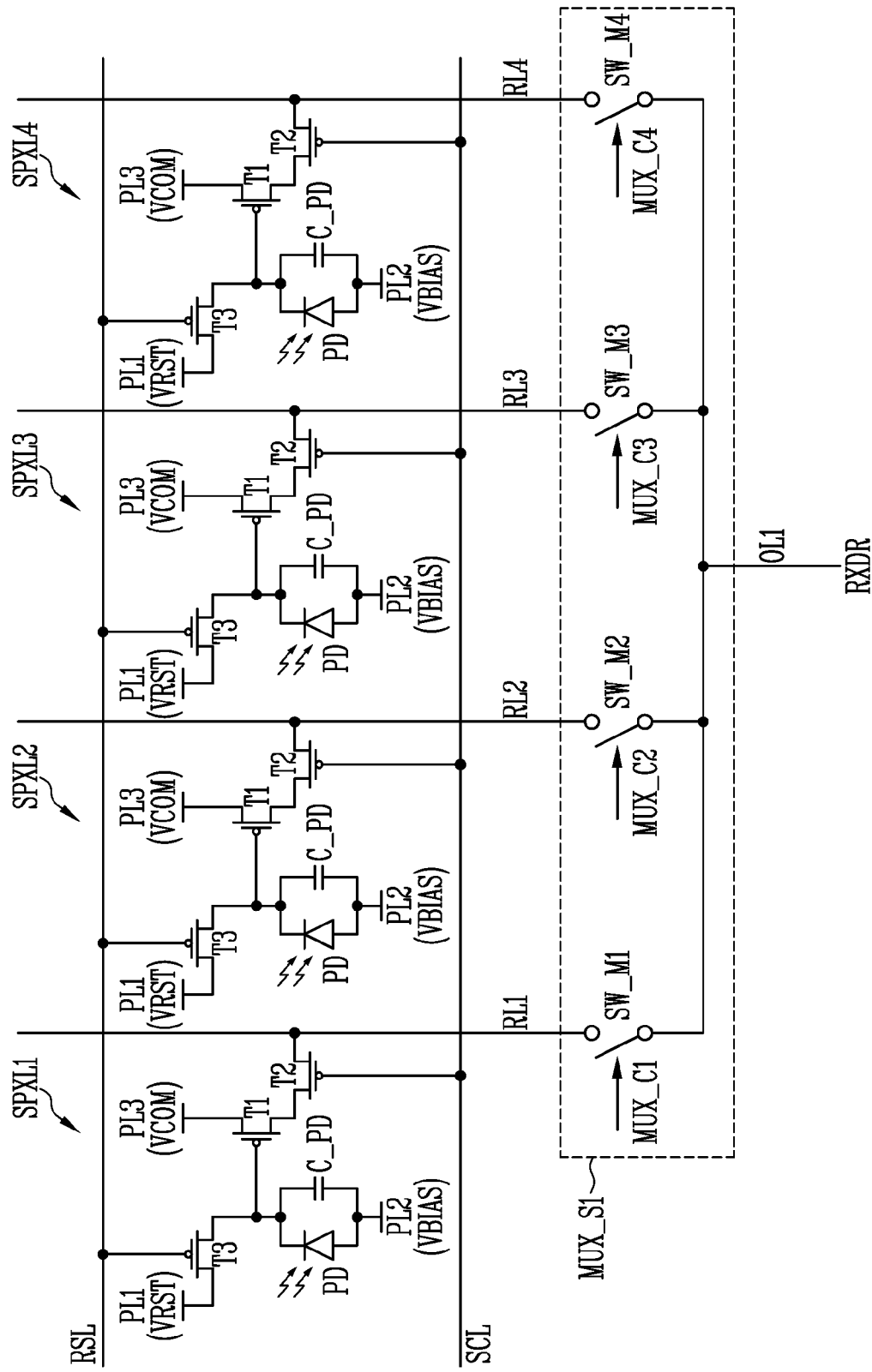
FIG. 5B is a circuit diagram of a multiplexer included in the input sensing device of FIG. 5A according to some example embodiments of the present invention.

FIG. 5A illustrates a block diagram of an example of the input sensing device of FIG. 3. FIG. 5B illustrates a circuit diagram of an example of a multiplexer included in the input sensing device of FIG. 5A. In FIG. 5B, a first sub-multiplexer MUX_S1 included in a multiplexer MUX is shown, and sensor pixels SPXL1 to SPXL4 are further shown to describe an operation of the first sub-multiplexer MUX_S1.

Referring to FIG. 3, FIG. 5A, and FIG. 5B, the fingerprint detector 220 (or the input sensing device FDD) may further include the multiplexer MUX and output lines OL1 to OLp (where p is a positive integer less than m).

The multiplexer MUX may be connected between the read-out lines RL1 to RLm and the output lines OL1 to OLp, and it may connect some selected from the read-out lines RL1 to RLm to the output lines OL1 to OLp. In this case, the vertical driver 222 may be connected to the output lines OL1 to OLp. The multiplexer MUX may be formed with the photo sensor PS on one substrate, but is not limited thereto.

According to some example embodiments, the multiplexer MUX may include a plurality of sub-multiplexers. The multiplexer MUX may include a k:1 multiplexer (or sub-multiplexer) that selects and outputs one of k inputs (where k is a positive integer). For example, the multiplexer MUX may include a 4:1 multiplexer that selects and outputs one of four inputs. In this case, p is m/4, and the multiplexer MUX may include m/4 sub-multiplexers. However, this is merely an example, and a ratio of input and output of the sub-multiplexer may be variously changed.

As shown in FIG. 5A and FIG. 5B, the first sub-multiplexer MUX_S1 may be connected between first to fourth read-out lines RL1, RL2, RL3, and RL4, and may connect one of the first to fourth read-out lines RL1, RL2, RL3, and RL4 to the first output line OL1.

As shown in FIG. 5B, the first sub-multiplexer MUX_S1 may include first to fourth switches SW_M1, SW_M2, SW_M3, and SW_M4. Each of the first to fourth switches SW_M1, SW_M2, SW_M3, and SW_M4 may be implemented as a transistor, and for example, each of the first to fourth switches SW_M1, SW_M2, SW_M3, and SW_M4 may be implemented as a P-type transistor.

The first switch SW_M1 may be connected between the first read-out line RL1 and the first output line OL1, and may connect the first read-out line RL1 and the first output line OL1 in response to a first switch control signal MUX_C1. Here, the first switch control signal MUX_C1 (and second to fourth switch control signals MUX_C2, MUX_C3, and MUX_C4) may be provided by the controller CON, but is not limited thereto.

For reference, while the first switch control signal MUX_C1 of a turn-on voltage level is applied to the first switch SW_M1 (that is, while the first switch SW_M1 is turned on), a scan signal of the turned-on voltage level may be applied to the scan line SCL. In this case, in response to the scan signal of the turn-on voltage level, a sensing signal of the first sensor pixel SPXL1 may be transmitted from the first sensor pixel SPXL1 to the first output line OL1 through the second transistor T2, the first read-out line RL1, and the first switch SW_M1.

Similar to the first switch SW_M1, the second switch SW_M2 may be connected between the second read-out line RL2 and the first output line OL1, and may connect the second read-out line RL2 and the first output line OL1 in response to the second switch control signal MUX_C2. While the second switch control signal MUX_C2 of the turn-on voltage level is applied to the second switch SW_M2 (that is, while the second switch SW_M2 is turned on), a scan signal of the turned-on voltage level may be applied to the scan line SCL. In this case, in response to the scan signal of the turn-on voltage level, a sensing signal of the second sensor pixel SPXL2 may be transmitted from the second sensor pixel SPXL2 to the first output line OL1 through the second transistor T2, the second read-out line RL2, and the second switch SW_M2.

The third switch SW_M3 may be connected between the third read-out line RL3 and the first output line OL1, and may connect the third read-out line RL3 and the first output line OL1 in response to the third switch control signal MUX_C3. While the third switch control signal MUX_C3 of the turn-on voltage level is applied to the third switch SW_M3, a scan signal of the turned-on voltage level may be applied to the scan line SCL. In this case, in response to the scan signal of the turn-on voltage level, a sensing signal of the third sensor pixel SPXL3 may be transmitted from the third sensor pixel SPXL3 to the first output line OL1 through the second transistor T2, the third read-out line RL3, and the third switch SW_M3.

The fourth switch SW_M4 may be connected between the fourth read-out line RL4 and the first output line OL1, and may connect the fourth read-out line RL4 and the first output line OL1 in response to the fourth switch control signal MUX_C4. While the fourth switch control signal MUX_C4 of the turn-on voltage level is applied to the fourth switch SW_M4, a scan signal of the turned-on voltage level may be applied to the scan line SCL. In this case, in response to the scan signal of the turn-on voltage level, a sensing signal of the fourth sensor pixel SPXL4 may be transmitted from the fourth sensor pixel SPXL4 to the first output line OL1 through the second transistor T2, the fourth read-out line RL4, and the fourth switch SW_M4.

According to some example embodiments, because the first to fourth switches SW_M1, SW_M2, SW_M3, and SW_M4) are selectively turned on, that is, because the first to fourth switches SW_M1, SW_M2, SW_M3, and SW_M4 are turned on in different periods, In response to the first to fourth switch control signals MUX_C1, MUX_C2, MUX_C3, and MUX_C4, a scan signal (or pulse) of the turn-on voltage level may be applied to the scan line SCL a plurality of times.

For reference, a case in which the scan signal of the turn-on voltage level is applied to the scan line SCL only in a period in which the first switch control signal MUX_C1 has the turn-on voltage level and in which the scan signal of the turn-on voltage level is not applied to the scan line SCL in periods in which the second to fourth switch control signals MUX_C2, MUX_C3, and MUX_C4 have the turn-on voltage level, may be assumed. In this case, a sensing signal of the second sensor pixel SPXL2 may be temporarily stored in the second read-out line RL2, and then may be outputted through the first output line OL1 at a point of time when the second switch control signal MUX_C2 has a turn-on voltage level. While the sensing signal of the second sensor pixel SPXL2 is temporarily stored in the second read-out line RL2, noise may be introduced into the sensing signal of the second sensor pixel SPXL2 by parasitic capacitance between adjacent lines and a turning-on/off operation of the second switch SW_M2. Similarly, noise may be introduced into the sensing signal of the third sensor pixel SPXL3 and the sensing signal of the fourth sensor pixel SPXL4.

Therefore, in response to the first to fourth switch control signals MUX_C1, MUX_C2, MUX_C3, and MUX_C4, when the scan signal (or pulse) of the turn-on voltage level is applied to the scan line SCL a plurality of times, the sensing signal of each of the sensor pixels SPXL1, SPXL2, SPXL3, and SPXL4 may be transmitted to the corresponding read-out line and may be directly outputted to the first output line OL1 through the corresponding switch. Accordingly, the noise introduced into each of the sensing signals outputted from the sensor pixels SPXL1, SPXL2, SPXL3, and SPXL4 may be reduced, and accuracy of fingerprint sensing may be improved. The configuration in which the scan signal of the turn-on voltage level is applied to the scan line SCL a plurality of times will be described later with reference to FIG. 11 and FIG. 14.

As described with reference to FIG. 5A and FIG. 5B, the input sensing device FDD may further include the multiplexer MUX. In this case, the number of channels (and pads) of the vertical driver 222 for receiving a sensing signal may be reduced, and an area and manufacturing cost of the vertical driver 222 (and the input detection circuit ROIC) may be reduced.

Figure 6:
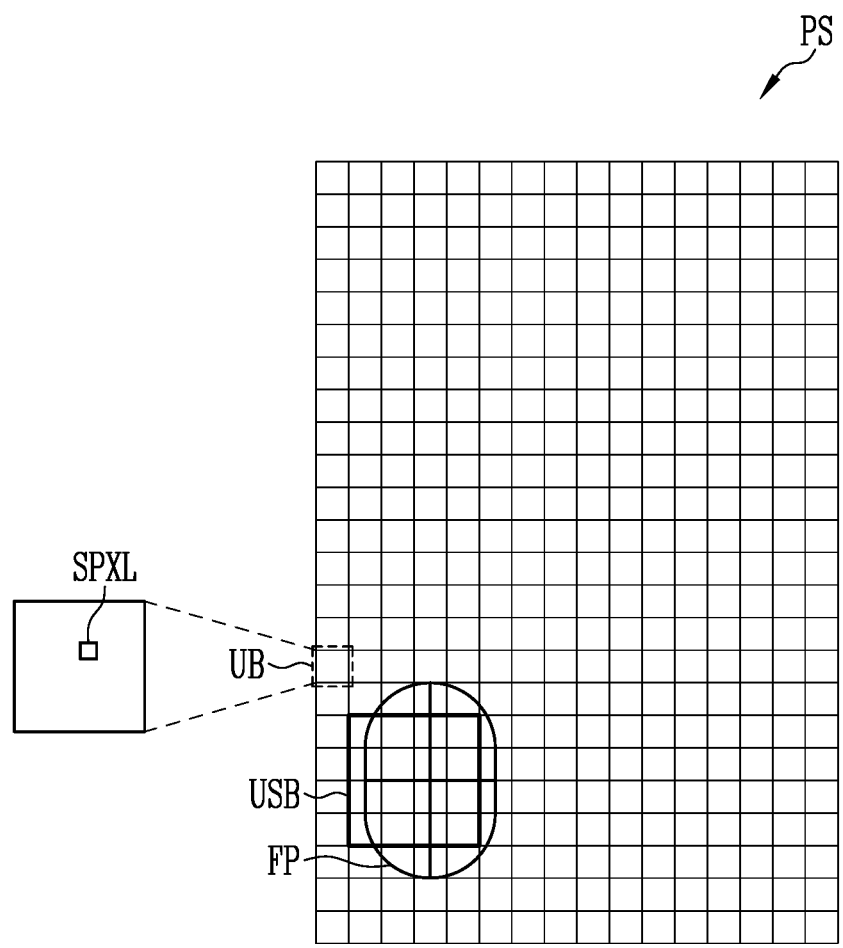
FIG. 6 is a top plan view of an example of a photo sensor included in the input sensing device of FIG. 3 according to some example embodiments of the present invention.

FIG. 6 illustrates a top plan view of an example of a photo sensor included in the input sensing device of FIG. 3. The photo sensor PS of FIG. 6 may also be applied to the input sensing device FDD of FIG. 5A.

Referring to FIG. 3, FIG. 5A, and FIG. 6, the photo sensor PS (or sensor pixels SPXL) may be divided into unit blocks UB including at least one sensor pixel SPX. The unit blocks UB (or unit blocks UB included in one row) may be independently driven from each other. For example, each of the unit blocks UB may include 32*32 sensor pixels SPXL. The number of sensor pixels SPXL included in each of the unit blocks UB is not limited thereto, and for example, the number of sensor pixels SPXL included in each of the unit blocks UB may be greater or less than 32*32. For better understanding and ease of description, hereinafter, it is assumed that each of the unit blocks UB includes 32*32 sensor pixels SPXL.

A unit sensing block USB, when a touch input occurs, may be defined as a portion of the photo sensor PS that must be operated for fingerprint sensing, corresponding to a size of a user's fingerprint FP (or finger). For example, the unit sensing block USB may be set to a size of about 1 cm*1 cm, about 2 cm*2 cm, etc., and may include 4*4 unit blocks UB (or 128*128 sensor pixels SPXL). The number of unit blocks UB included in each of the unit sensing blocks USB is not limited thereto, and for example, the number of unit blocks UB included in each of the unit sensing blocks USB may be greater or less than 4*4. Meanwhile, the remaining portion of the photo sensor PS excluding the unit sensing block USB may not operate.

The unit sensing block USB may be variably set based on a point where a touch input occurs (for example, a center point of the touch input). That is, whenever the touch input occurs, the position of the unit sensing block USB and the unit blocks UB included therein may be set differently.

As described with reference to FIG. 6, the photo sensor PS may separately operate for each unit block UB. For individual driving of the unit block UB, the horizontal driver 221 should be able to supply reset signals and scan signals for each unit block UB, and FIG. 7 may be referred to describe the horizontal driver 221 for this.

Figure 7:
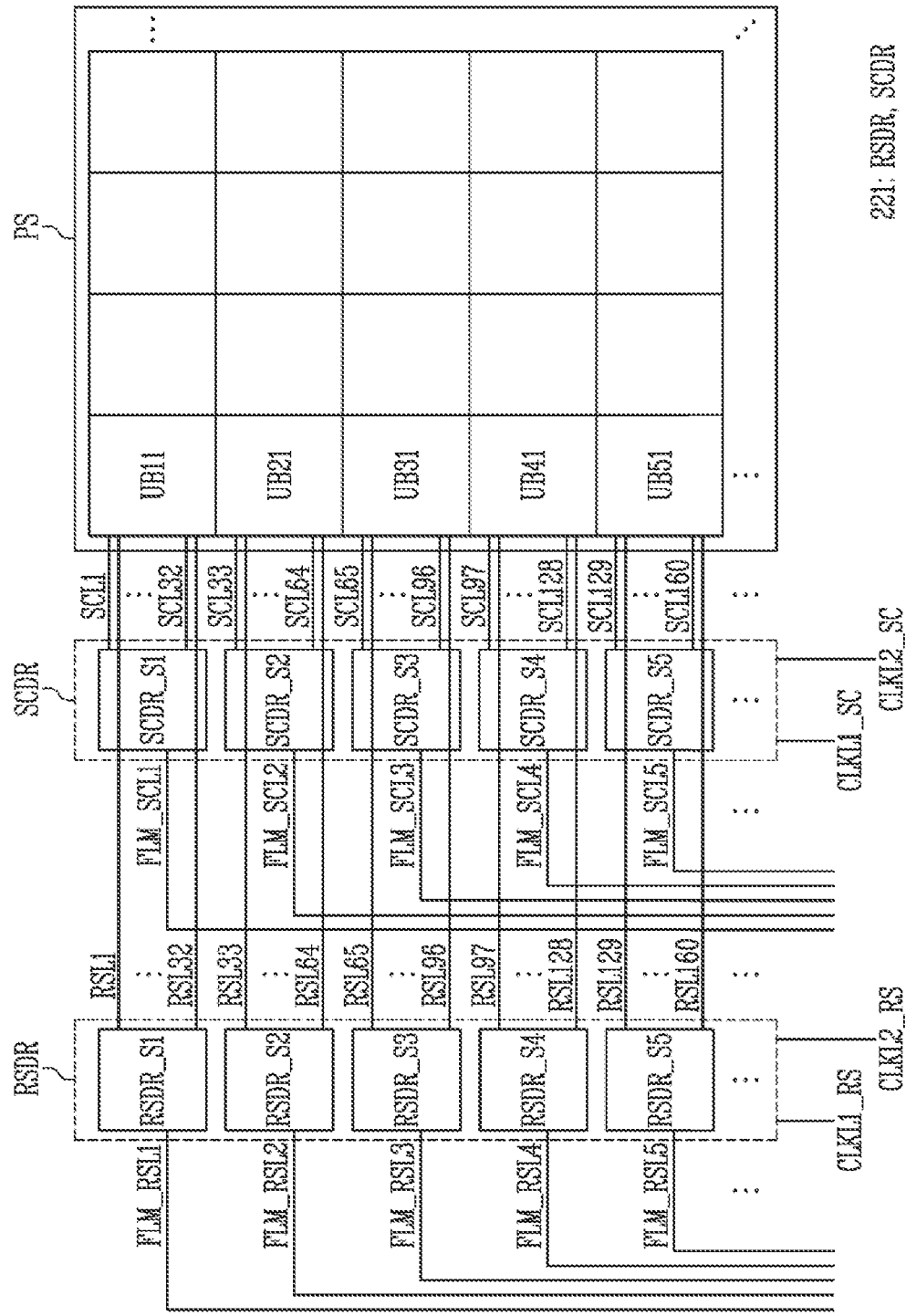
FIG. 7 is a block diagram of an example of a horizontal driver included in the input sensing device of FIG. 3 according to some example embodiments of the present invention.

FIG. 7 illustrates a block diagram of an example of a horizontal driver included in the input sensing device of FIG. 3. In FIG. 7, the photo sensor PS is further illustrated to describe an operation of the horizontal driver 221. The horizontal driver 221 of FIG. 7 may also be applied to the input sensing device FDD of FIG. 5A.

Referring to FIG. 3, FIG. 5A, FIG. 6, and FIG. 7, the horizontal driver 221 may include the reset driver RSDR and the scan driver (SCDR).

The reset driver RSDR may include sub-reset drivers RSDR_S1, RSDR_S2, RSDR_S3, RSDR_S4, and RSDR_S5 corresponding to unit blocks UB11, UB21, UB31, UB41, and UB51 of the photo sensor PS. That is, the unit blocks UB11, UB21, UB31, UB41, and UB51 are minimum units for configuring the sub-reset drivers RSDR_S1, RSDR_S2, RSDR_S3, RSDR_S4, and RSDR_S5 are mutually independently driven. Meanwhile, the unit sensing block USB described above with reference to FIG. 6 is a unit necessary for fingerprint sensing.

The reset driver RSDR may be connected to reset start signal lines FLM_RSL1, FLM_RSL2, FLM_RSL3, FLM_RSL4, and FLM_RSL5 and reset clock lines CLKL1_RS and CLKL2_RS for mutually independently driving the sub-reset drivers RSDR_S1, RSDR_S2, RSDR_S3, RSDR_S4, and RSDR_S5. The reset start signal lines FLM_RSL1, FLM_RSL2, FLM_RSL3, FLM_RSL4, and FLM_RSL5 and the reset clock lines CLKL1_RS and CLKL2_RS may be included in the first control lines CL1 (see FIG. 3). Reset start signals may be mutually independently applied to reset start signal lines FLM_RSL1, FLM_RSL2, FLM_RSL3, FLM_RSL4, and FLM_RSL5.

A first reset clock signal and a second reset clock signal are respectively applied to the reset clock lines CLKL1_RS and CLKL2_RS, and for example, the second reset clock signal may have a waveform in which the first reset clock signal is phase-inverted, or a phase in which the first reset clock signal is delayed by 180 degrees or a waveform in which the first reset clock signal is delayed by a specific time.

The first sub-reset driver RSDR_S1 may be connected to the first reset start signal line FLM_RSL1, generate reset signals corresponding to a first reset start signal (that is, a reset start signal applied to the first reset start signal line FLM_RSL1) by using the reset clock signals, and provide the reset signals to the 11th unit block UB11. For example, the first sub-reset driver RSDR_S1 may sequentially generate reset signals in a form of sequentially shifting the first reset start signal by using reset clock signals. As shown in FIG. 7, the first sub-reset driver RSDR_S1 may be connected to first to 32nd reset lines RSL1 to RSL32 corresponding to the 11th unit block UB11, and may sequentially provide the reset signals (for example, first to 32nd reset start signals) corresponding to the first reset start signal to the first to 32nd reset lines RSL1 to RSL32.

Similar to the first sub-reset driver RSDR_S1, the second sub-reset driver RSDR_S2 may be connected to the second reset start signal line FLM_RSL2, generate reset signals corresponding to a second reset start signal (that is, a reset start signal applied to the second reset start signal line FLM_RSL2) by using the reset clock signals, and provide the reset signals to the 21st unit block UB21. As shown in FIG. 7, the second sub-reset driver RSDR_S2 may be connected to 33rd to 64th reset lines RSL33 to RSL64 corresponding to the 21st unit block UB21, and may sequentially provide the reset signals (for example, 33rd to 64th reset start signals) corresponding to the second reset start signal to the 33rd to 64th reset lines RSL33 to RSL64.

The third sub-reset driver RSDR_S3 may be connected to the third reset start signal line FLM_RSL3, generate reset signals corresponding to a third reset start signal (that is, a reset start signal applied to the third reset start signal line FLM_RSL3) by using the reset clock signals, and provide the reset signals to 65th to 96th reset lines RSL65 to RSL96 corresponding to the 31st unit block UB31.

The fourth sub-reset driver RSDR_S4 may be connected to the fourth reset start signal line FLM_RSL4, generate reset signals corresponding to a fourth reset start signal (that is, a reset start signal applied to the fourth reset start signal line FLM_RSL4) by using the reset clock signals, and provide the reset signals to 97th to 128th reset lines RSL97 to RSL128 corresponding to the 41st unit block UB41.

The fifth sub-reset driver RSDR_S5 may be connected to the fifth reset start signal line FLM_RSL5, generate reset signals corresponding to a fifth reset start signal (that is, a reset start signal applied to the fifth reset start signal line FLM_RSL5) by using the reset clock signals, and provide the reset signals to 129th to 160th reset lines RSL129 to RSL160 corresponding to the 51st unit block UB51.

When the 11th, 21st, 31st, and 41st unit blocks UB11, UB21, UB31, and UB41 may be included in one unit sensing block USB, according to some example embodiments, the first to fourth reset start signals may be sequentially provided only to the first to fourth sub-reset drivers RSDR_S1, RSDR_S2, RSDR_S3, and RSDR_S4, and the reset start signal may not be provided to the fifth sub-reset driver RSDR_S5 (and other sub-reset drivers). That is, only the first to fourth sub-reset drivers RSDR_S1, RSDR_S2, RSDR_S3, and RSDR_S4 may sequentially operate.

However, embodiments according to the present invention are not limited thereto, and for example, according to some example embodiments, before only the first to fourth sub-reset drivers RSDR_S1, RSDR_S2, RSDR_S3, and RSDR_S4 sequentially operate, all of the sub-reset drivers RSDR_S1, RSDR_S2, RSDR_S3, RSDR_S4, and RSDR_S5 (that is, all of the reset driver RSDR) may simultaneously (or concurrently) operate.

The scan driver SCDR may include sub-scan drivers SCDR_S1, SCDR_S2, SCDR_S3, SCDR_S4, and SCDR_S5 corresponding to the unit blocks UB11, UB21, UB31, UB41, and UB51 of the photo sensor PS. The scan driver SCDR may be connected to scan start signal lines FLM_SCL1, FLM_SCL2, FLM_SCL3, FLM_SCL4, and FLM_SCL5 and scan clock lines CLKL1_SC and CLKL2_SC for mutually independently driving the sub-scan drivers SCDR_S1, SCDR_S2, SCDR_S3, SCDR_S4, and SCDR_S5. The scan start signal lines FLM_SCL1, FLM_SCL2, FLM_SCL3, FLM_SCL4, and FLM_SCL5 and the scan dock lines CLKL1_SC and CLKL2_SC may be included in the second control lines CL2 (see FIG. 3). Scan start signals may be mutually independently applied to the scan start signal lines FLM_SCL1, FLM_SCL2, FLM_SCL3, FLM_SCL4, and FLM_SCL5. A first scan dock signal and a second scan clock signal are respectively applied to the scan clock lines CLKL1_SC and CLKL2_SC, and for example, the second scan dock signal may have a waveform in which the first scan clock signal is phase-inverted, or a phase in which the first scan dock signal is delayed by 180 degrees or a waveform in which the first scan clock signal is delayed by a specific time.

The first sub-scan driver SCDR_S1 may be connected to the first scan start signal line FLM_SCL1, generate scan signals corresponding to the first scan start signal (that is, the scan start signal applied to the first scan start signal line FLM_SCL1) by using the scan clock signals, and provide the scan signals to the 11th unit block UB11. For example, the first sub-scan driver SCDR_S1 may sequentially generate scan signals in a form of sequentially shifting the first scan start signal by using scan clock signals. As shown in FIG. 7, the first sub-scan driver SCDR_S1 may be connected to first to 32nd scan lines SCL1 to SCL32 corresponding to the 11th unit block UB11, and may sequentially provide the scan signals (for example, first to 32nd scan start signals) corresponding to the first scan start signal to the first to 32nd scan lines SCL1 to SCL32.

Similar to the first sub-scan driver SCDR_S1, the second sub-scan driver SCDR_S2 may be connected to the second scan start signal line FLM_SCL2, generate scan signals corresponding to the second scan start signal (that is, the scan start signal applied to the second scan start signal line FLM_SCL2) by using the scan dock signals, and provide the scan signals to 33rd to 64th scan lines SCL33 to SCL64 corresponding to the 21st unit block UB21.

The third sub-scan driver SCDR_S3 may be connected to the third scan start signal line FLM_SCL3, generate scan signals corresponding to the third scan start signal (that is, the scan start signal applied to the third scan start signal line FLM_SCL3) by using the scan dock signals, and provide the scan signals to 65th to 96th scan lines SCL65 to SCL96 corresponding to the 31st unit block UB31.

The fourth sub-scan driver SCDR_S4 may be connected to the fourth scan start signal line FLM_SCL4, generate scan signals corresponding to the fourth scan start signal (that is, the scan start signal applied to the fourth scan start signal line FLM_SCL4) by using the scan dock signals, and provide the scan signals to 97th to 128th scan lines SCL97 to SCL128 corresponding to the 41st unit block UB41.

The fifth sub-scan driver SCDR_S5 may be connected to the fifth scan start signal line FLM_SCL5, generate scan signals corresponding to the fifth scan start signal (that is, the scan start signal applied to the fifth scan start signal line FLM_SCL5) by using the scan dock signals, and provide the scan signals to 129th to 160th scan lines SCL129 to SCL160 corresponding to the 51st unit block UB51.

When the 11th, 21st, 31st, and 41st unit blocks UB11, UB21, UB31, and UB41 may be included in one unit sensing block USB, according to some example embodiments, the first to fourth scan start signals may be sequentially provided only to the first to fourth sub-scan drivers SCDR_S1, SCDR_S2, SCDR_S3, and SCDR_S4, and the scan start signal may not be provided to the fifth sub-scan driver SCDR_S5 (and other sub-scan drivers). That is, only the first to fourth sub-scan drivers SCDR_S1, SCDR_S2, SCDR_S3, and SCDR_S4 may sequentially operate.

As described with reference to FIG. 7, the horizontal driver 221 may include the sub-reset drivers RSDR_S1, RSDR_S2, RSDR_S3, RSDR_S4, and RSDR_S5 and the sub-scan drivers SCDR_S1, SCDR_S2, SCDR_S3, SCDR_S4, and SCDR_S5 for individually driving each of the unit blocks UB, each of the sub-reset drivers RSDR_S1, RSDR_S2, RSDR_S3, RSDR_S4, and RSDR_S5 may independently operate in response to a corresponding reset start signal, and each of the sub-scan drivers SCDR_S1, SCDR_S2, SCDR_S3, SCDR_S4, and SCDR_S5 may independently operate in response to a corresponding scan start signal.

Figure 8:
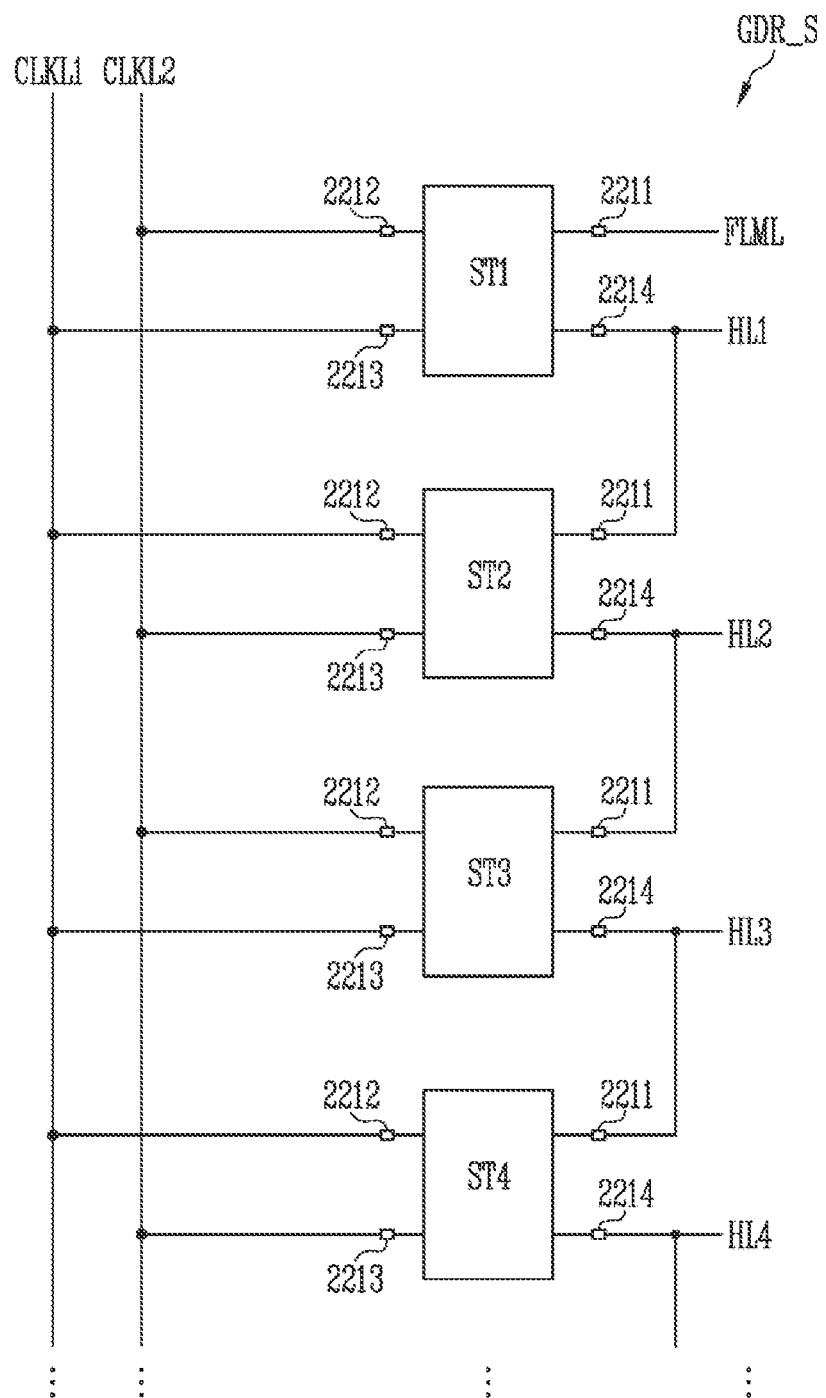
FIG. 8 is a block diagram of an example of a sub-driver included in the horizontal driver of FIG. 7 according to some example embodiments of the present invention.

FIG. 8 illustrates a block diagram of an example of a sub-driver included in the horizontal driver of FIG. 7. Because the sub-reset drivers RSDR_S1, RSDR_S2, RSDR_S3, RSDR_S4, and RSDR_S5 and the sub-scan drivers SCDR_S1, SCDR_S2, SCDR_S3, SCDR_S4, and SCDR_S5 shown in FIG. 7 are substantially the same as or similar to each other except for the lines connected them (that is, the reset/scan start signal lines, the clock lines, the reset/scan lines), a sub-driver GDR_S will be described, including descriptions of the sub-reset drivers RSDR_S1, RSDR_S2, RSDR_S3, RSDR_S4, and RSDR_S5 and the sub-scan drivers SCDR_S1, SCDR_S2, SCDR_S3, SCDR_S4, and SCDR_S5.

Referring to FIG. 7 and FIG. 8, the sub-driver GDR_S may include a plurality of stages ST1 to ST4. Each of the stages ST1 to ST4 is connected to one of gate lines HL1 to HL4, and is driven corresponding to clock lines CLKL1 and CLKL2. Here, the gate lines HL1 to HL4 may correspond to the reset lines RSL1 to RSL32 and RSL33 to RS64 or to the scan lines SCL1 to SCL32 and SCL33 to SCL 64 shown in FIG. 7, and the clock lines CLKL1 and CLKL2 may correspond to the reset clock lines CLKL1_RS and CLKL2_RS or to the scan clock lines CLKL1_SC and CLKL2_SC shown in FIG. 7. The stages ST1 to ST4 may be configured of circuits substantially equivalent to each other.

Each of the stages ST1 to ST4 may be provided with a first input terminal 2211 to a third input terminal 2213 and an output terminal 2214.

The first input terminal 2211 of each of the stages ST1 to ST4 is connected to a start signal line FLML or the output terminal 2214 of a previous stage, and it may receive a start signal or an output signal of the previous stage (for example, a previous reset signal or previous scan signal). Here, the start signal line FLML may correspond to the reset start signal lines FLM_RSL1, FLM_RSL2, FLM_RSL3, FLM_RSL4, and FLM_RSL5 or the scan start signal lines FLM_SCL1, FLM_SCL2, FLM_SCL3, FLM_SCL4, and FLM_SCL5 shown in FIG. 7.

The first input terminal 2211 of the first stage ST1 may be connected to the start signal line FLML to receive the start signal, and the first input terminals 2211 of the remaining stages ST2 to ST4 may receive the output signal of the previous stage.

In odd numbered stages ST1 and ST3, the second input terminal 2212 may be connected to the second dock line CLKL2 to receive the second dock signal, and the third input terminal 2213 may be connected to the first dock line CLKL1 to receive the first dock signal. In even numbered stages ST2 and ST4, the second input terminal 2212 may be connected to the first dock line CLKL1 to receive the first dock signal, and the third input terminal 2213 may be connected to the second dock line CLKL2 to receive the second dock signal.

The first dock signal and the second dock signal have the same cycle, and phases thereof may not overlap each other.

Figure 9:
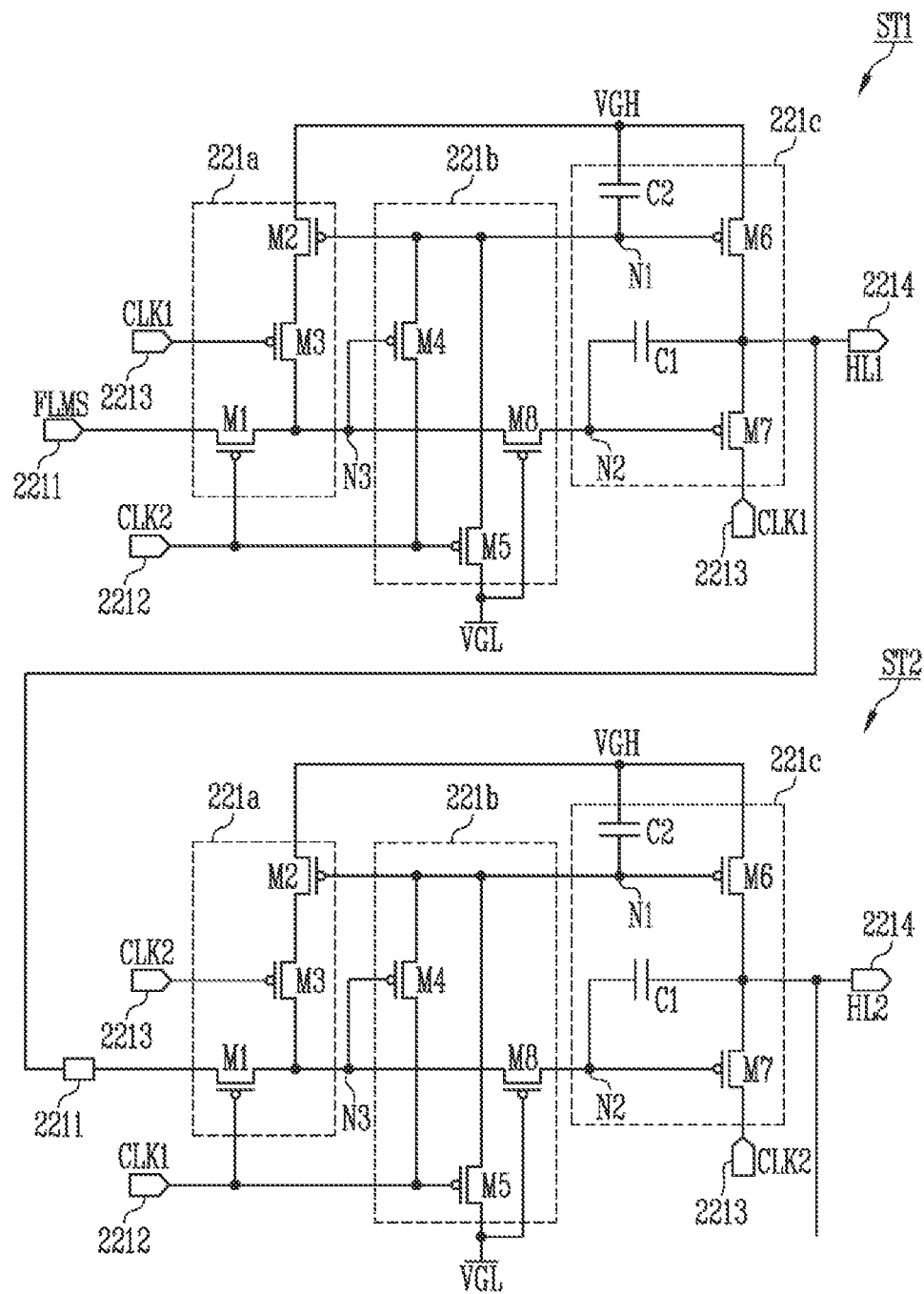
FIG. 9 is a circuit diagram of an example of stages included in the sub-driver of FIG. 8 according to some example embodiments of the present invention.

FIG. 9 may be referred to describe a configuration of each of the stages ST1 to ST4.

FIG. 9 illustrates a circuit diagram of an example of stages included in the sub-driver of FIG. 8. In FIG. 8, because the odd numbered stages ST1 and ST3 are substantially the same as or similar to each other and the even numbered stages ST2 and ST4 are substantially the same as or similar to each other, for better understanding and ease of description, examples of the stages ST1 and ST2 are illustrated in FIG. 9.

Referring to FIG. 8 and FIG. 9, the first stage ST1 may include a first node controller 221a, a second node controller 221b, and a buffer part 221c.

The first node controller 221a may transmit a start signal FLM or first voltage VGH (or first power voltage) to a third node N3 based on the first dock signal CLK1 and the second clock signal CLK2. The first node controller 221a may include a first switching element M1, a second switching element M2, and a third switching element M3.

The first switching element M1 may include a first electrode connected to the first input terminal 2211, a second electrode connected to the third node N3, and a gate electrode connected to the second input terminal 2212.

The second switching element M2 may include a first electrode that receives the first voltage VGH (or that is connected to the first power line to which the first voltage VGH is applied), a second electrode connected to the third node N3 via the third switching element M3, and a gate electrode connected to a first node N1.

The third switching element M3 may include a first electrode connected to the second electrode of the second switching element M2, a second electrode connected to the third node N3, and a gate electrode connected to the third input terminal 2213. Here, the second and third switching elements M2 and M3 may be connected in series with each other.

The second node controller 221b may transmit the second voltage VGL (or, the second power voltage) or the second clock signal CLK2 to the first node N1 based on the second dock signal CLK2 and a signal (or voltage level) of the third node N3. The second node controller 221b may include a fourth switching element M4 and a fifth switching element M5. In addition, the second node controller 221b may further include an eighth switching element M8.

The fourth switching element M4 may include a first electrode connected to the first node N1, a second electrode connected to the second input terminal 2212, and a gate electrode connected to the third node N3.

The fifth switching element M5 may include a first electrode connected to the first node N1, a second electrode that receives the second voltage VGL (or that is connected to the second power line to which the second voltage VGL is applied), and a gate electrode connected to the second input terminal 2212.

The eighth switching element M8 may include a first electrode connected to the third node N3, a second electrode connected to a second node N2, and a gate electrode receiving the second voltage VGL.

The buffer part 221c may output a first gate signal (for example, a reset signal or scan signal) including the first clock signal CLK1 as a pulse based on a signal of the first node N1 and a signal of the second node N2. The first gate signal can be provided as a carry signal to the second stage ST2.

The buffer part 221c may include a sixth switching element M6 (or pull-up switching element) and a seventh switching element M7 (or pull-down switching element). The sixth switching element M6 may include a first electrode that receives the first voltage VGH (or that is connected to the first power line to which the first voltage VGH is applied), a second electrode connected to the output terminal 2214, and a gate electrode connected to the first node N1.

The seventh switching element M7 may include a first electrode connected to the output terminal 2214, a second electrode connected to the third input terminal 2213, and a gate electrode connected to the second node N2.

The buffer part 221c may further include a first capacitor C1 and a second capacitor C2.

The first capacitor C1 may be formed or connected between the first electrode of the seventh switching element M7 and the gate electrode of the seventh switching element M7. The second capacitor C2 may be formed or connected between the first electrode of the sixth switching element M6 and the gate electrode of the sixth switching element M6.

As shown in FIG. 9, because the circuit configuration of the second stage ST2 is substantially the same as that of the first stage ST1, redundant descriptions will not be repeated.

Meanwhile, in FIG. 9, the first to seventh switching elements M1 to M7 are shown to be implemented as a P-type transistor, but this is merely an example, and embodiments according to the present invention are not limited thereto. For example, the first to seventh switching element M1 to M7 may be implemented as an N-type transistor.

As described with reference to FIG. 8 and FIG. 9, the sub-driver GDR_S (or, the sub-reset drivers RSDR_S1, RSDR_S2, RSDR_S3, RSDR_S4, and RSDR_S5 and the sub-scan drivers SCDR_S1, SCDR_S2, SCDR_S3, SCDR_S4, and SCDR_S5 shown in FIG. 7) may output gate signals while sequentially shifting the start signal FLM.

Figure 10:
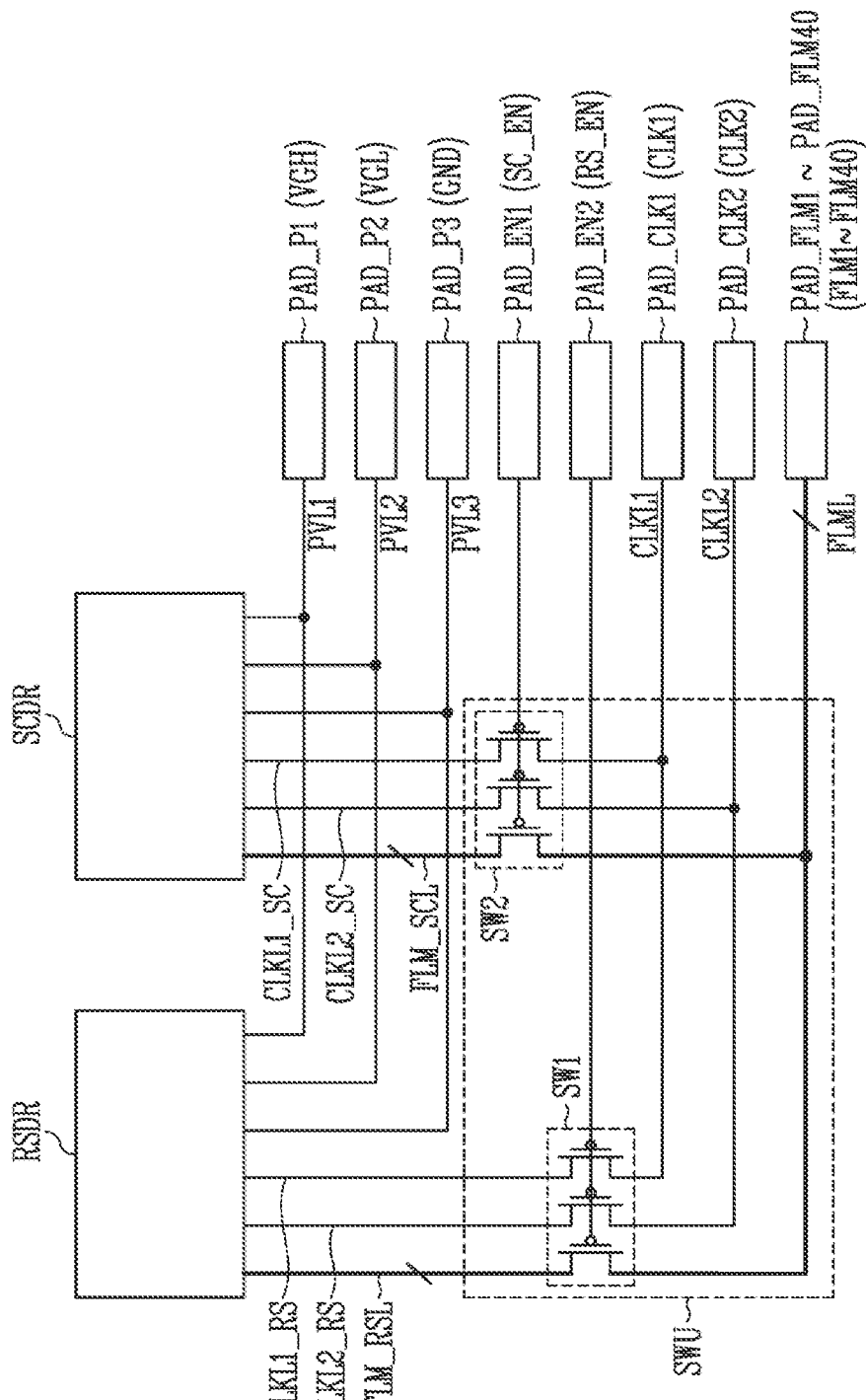
FIG. 10 is a circuit diagram of an example of a selector included in the input sensing device of FIG. 3 according to some example embodiments of the present invention.

FIG. 10 illustrates a circuit diagram of an example of a selector included in the input sensing device of FIG. 3. The selector SWU of FIG. 10 may also be applied to the input sensing device FDD of FIG. 5A.

Referring to FIG. 3, FIG. 5A, and FIG. 6 to FIG. 10, the selector SWU may include a first switching unit SW1 (or a first switching block) and a second switching unit SW2 (or a second switching block).

The first switching unit SW1 may be connected between pads PAD_CLK1, PAD_CLK2, and PAD_FLM1 to PAD_FLM40 and the reset driver RSDR. Here, the pads PAD_CLK1, PAD_CLK2, and PAD_FLM1 to PAD_FLM40 are connected to the controller CON, the first dock signal CLK1 may be applied to the first dock pad PAD_CLK1, the second dock signal CLK2 may be applied to the second dock pad PAD_CLK2, and a plurality of start signals (for example, 40 start signals) may be applied to the start signal pads PAD_FLM1 to PAD_FLM40, respectively.

As shown in FIG. 10, the first switching unit SW1 may include a transistor connected between the first clock line CLKL1 and the first reset clock line CLKL1_RS, a transistor connected between the second clock line CLKL2 and the second reset clock line CLKL2_RS, and transistors connected between the start signal lines FLML and reset start signal lines FLM_RSL. Here, the first clock line CLKL1, the second clock line CLKL2, and the start signal lines FLM_RSL may be included in the reference control line CL0 described with reference to FIG. 3.

A gate electrode of each of the transistors included in the first switching unit SW1 is connected to a second enable signal pad PAD_EN2, and each of the transistors may be turned on in response to a reset enable signal RS_EN applied to the second enable signal pad PAD_EN2. That is, in response to the reset enable signal RS_EN, the first clock signal CLK1, the second clock signal CLK2, and the start signal FLM1 to FLM40 may be provided to the reset driver RSDR.

The second switching unit SW2 may be connected between the pads PAD_CLK1, PAD_CLK2, and PAD_FLM1 to PAD_FLM40 and the scan driver SCDR.

As shown in FIG. 10, the second switching unit SW2 may include a transistor connected between the first clock line CLKL1 and the first scan clock line CLKL1_SC, a transistor connected between the second clock line CLKL2 and the second scan clock line CLKL2_SC, and transistors connected between the start signal lines FLML and scan start signal lines FLM_SCL. A gate electrode of each of the transistors included in the second switching unit SW2 is connected to a first enable signal pad PAD_EN1, and each of the transistors may be turned on in response to a scan enable signal SC_EN applied to the first enable signal pad PAD_EN1. That is, in response to the scan enable signal SC_EN, the first clock signal CLK1, the second dock signal CLK2, and the start signals FLM1 to FLM40 may be provided to the scan driver SCDR.

Meanwhile, the reset driver RSDR and the scan driver SCDR may be connected to the first power pad PAD_P1 through a first power line PVL1, connected to the second power pad PAD_P2 through a second power line PVL2, and connected to the third power pad PAD_P3 via a third power line PVL3. The first voltage VGH, the second voltage VGL, and the ground voltage GND described in FIG. 10 may be applied to the first, second, and third power pads PAD_P1, PAD_P2, and PAD_P3. The ground voltage GND may cover the reset driver RSDR and the scan driver SCDR, and may be used for a shield to prevent or reduce noise from being introduced from outside.

As described with reference to FIG. 10, the selector SWU may provide the first clock signal CLK1, the second clock signal CLK2, and the start signals FLM1 to FLM40 to the reset driver RSDR in response to the reset enable signal RS_EN, or may provide the first clock signal CLK1, the second clock signal CLK2, and the start signals FLM1 to FLM40 to the scan driver SCDR in response to the scan enable signal SC_EN. Therefore, the number of the pads and control lines (and output channels of the controller CON) for transmitting the first dock signal CLK1, the second dock signal CLK2, and the start signals FLM1 to FLM40 for the reset driver RSDR and the scan driver SCDR may be reduced, and the area and manufacturing cost of the input detection circuit ROIC (see FIG. 3) may be reduced.

Figure 11:
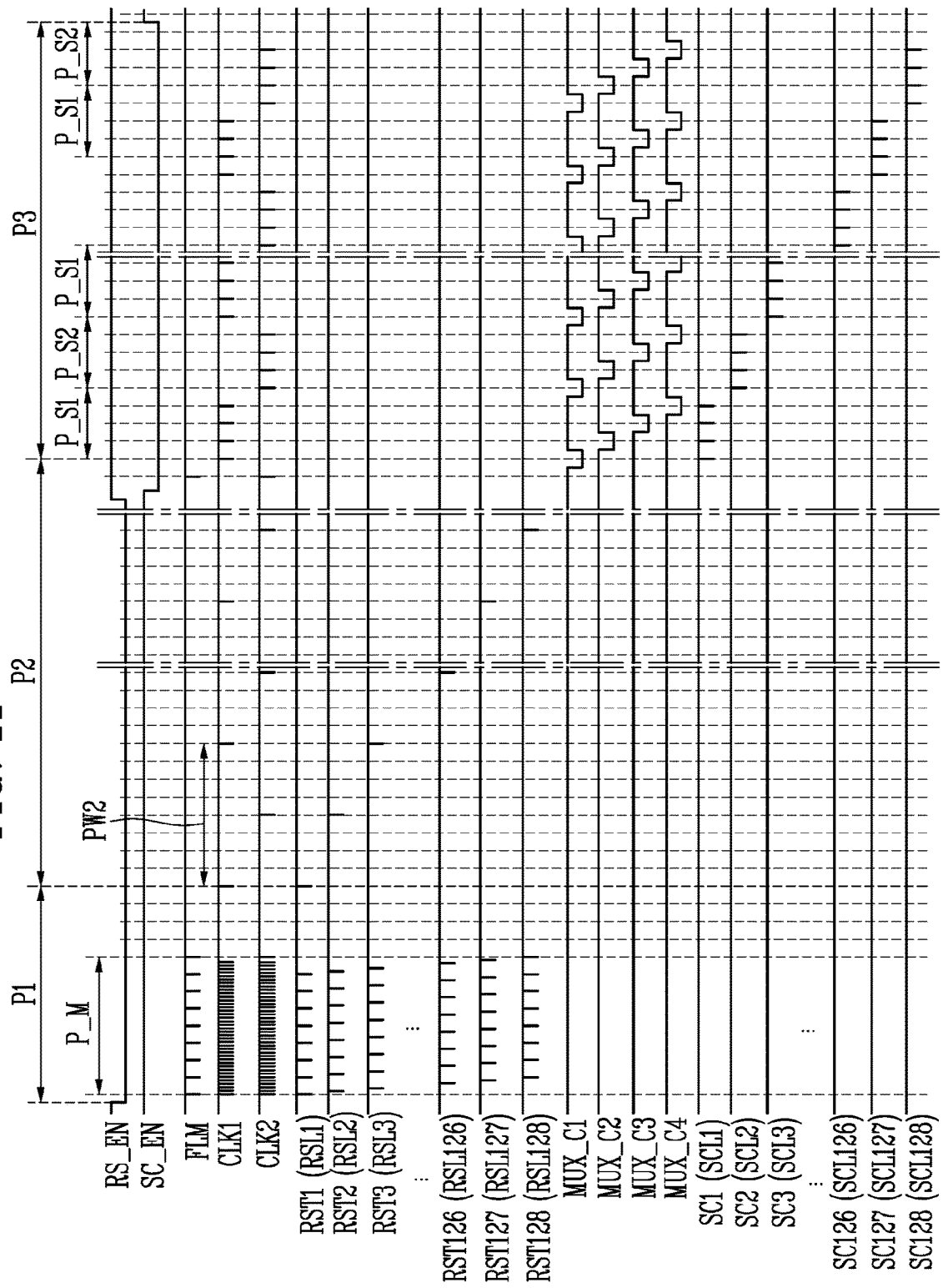
FIG. 11 is a waveform diagram for explaining an operation of the input sensing device of FIG. 5A according to some example embodiments of the present invention.
Figure 12:
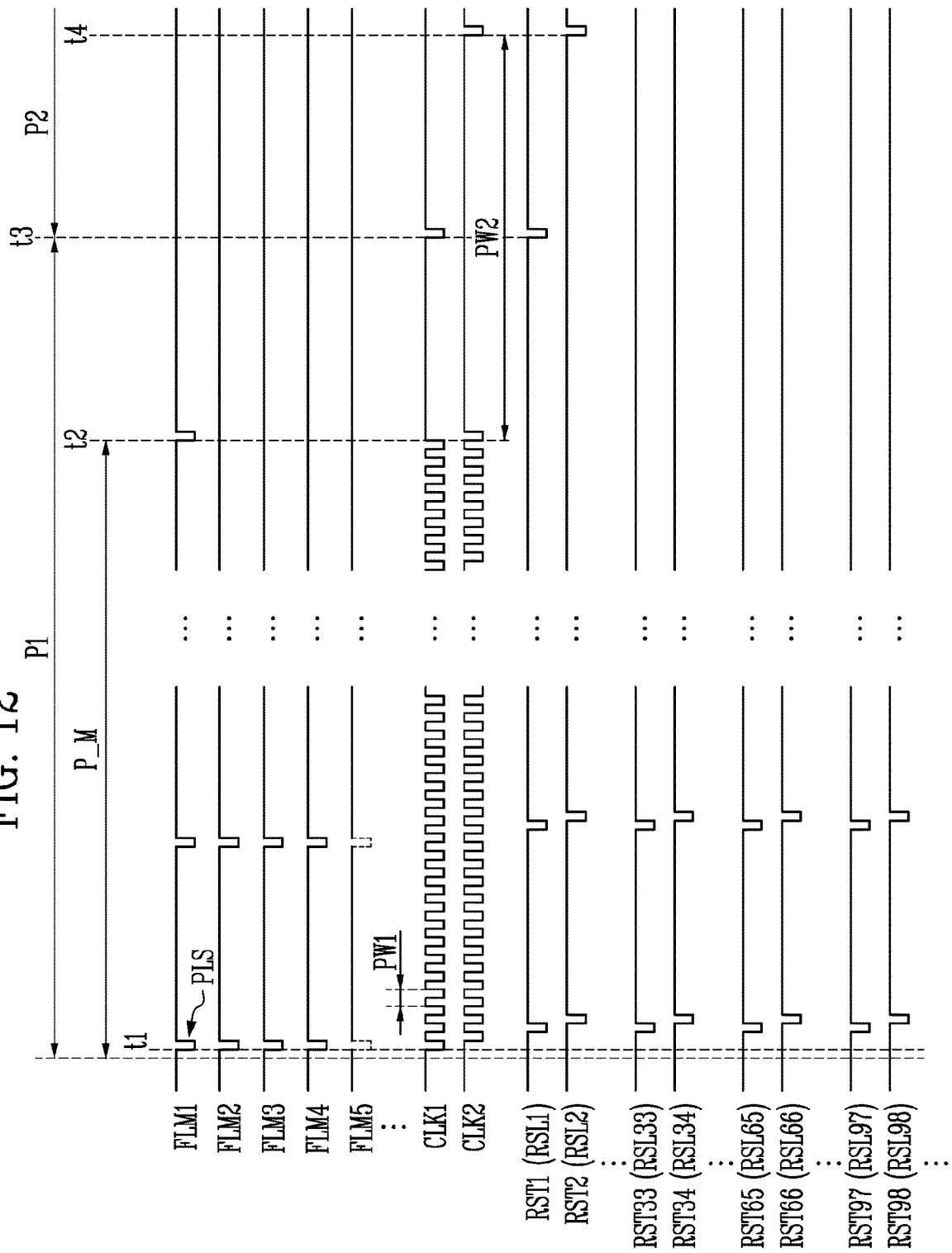
FIG. 12 is a waveform diagram for explaining an operation in a first period of the input sensing device of FIG. 5A according to some example embodiments of the present invention.
Figure 13:
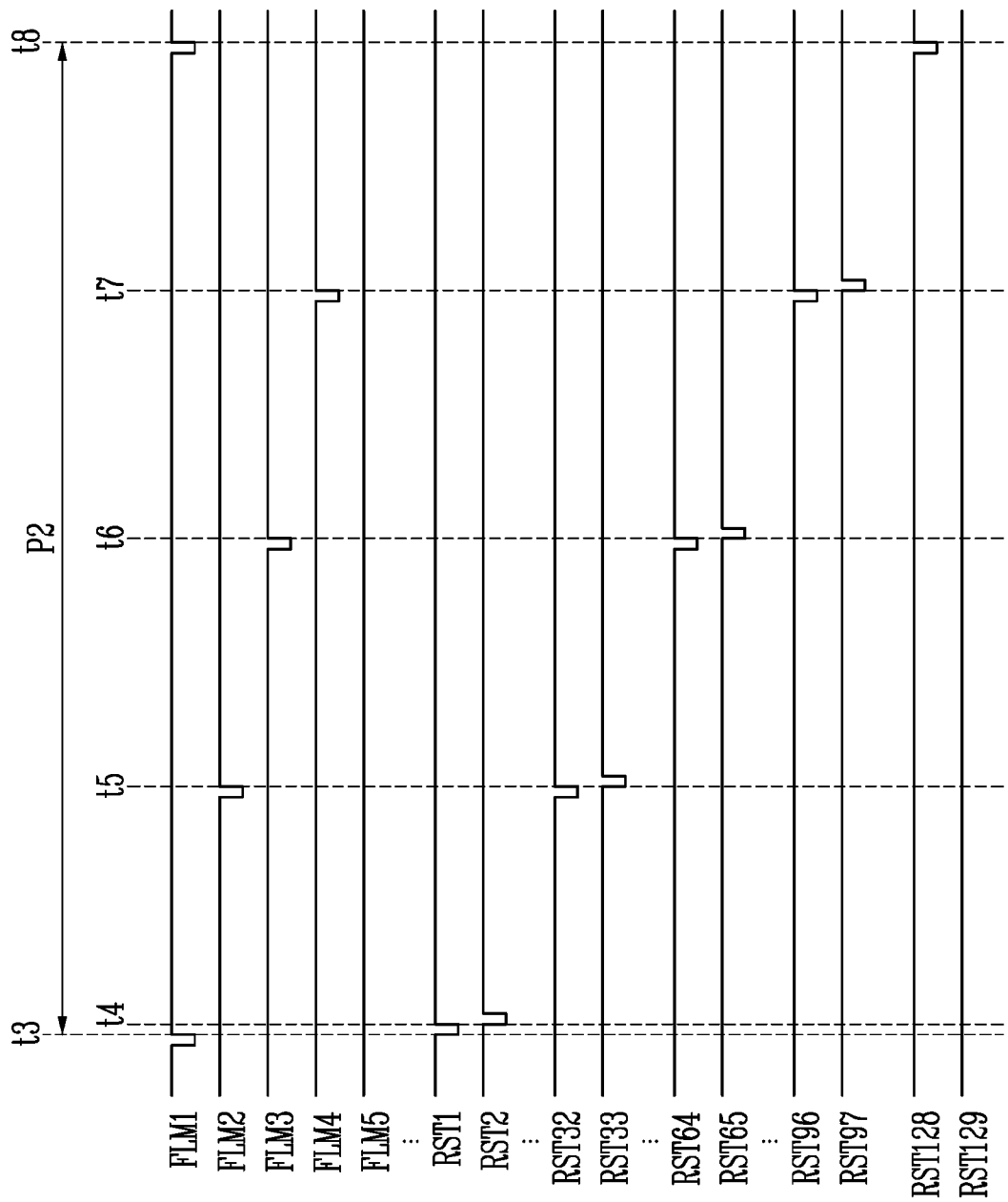
FIG. 13 is a waveform diagram for explaining an operation in a second period of the input sensing device of FIG. 5A according to some example embodiments of the present invention.

FIG. 11 illustrates a waveform diagram for explaining an operation of the input sensing device of FIG. 5A. FIG. 12 illustrates a waveform diagram for explaining an operation in a first period of the input sensing device of FIG. 5A. FIG. 13 illustrates a waveform diagram for explaining an operation in a second period of the input sensing device of FIG.

Figure 14:
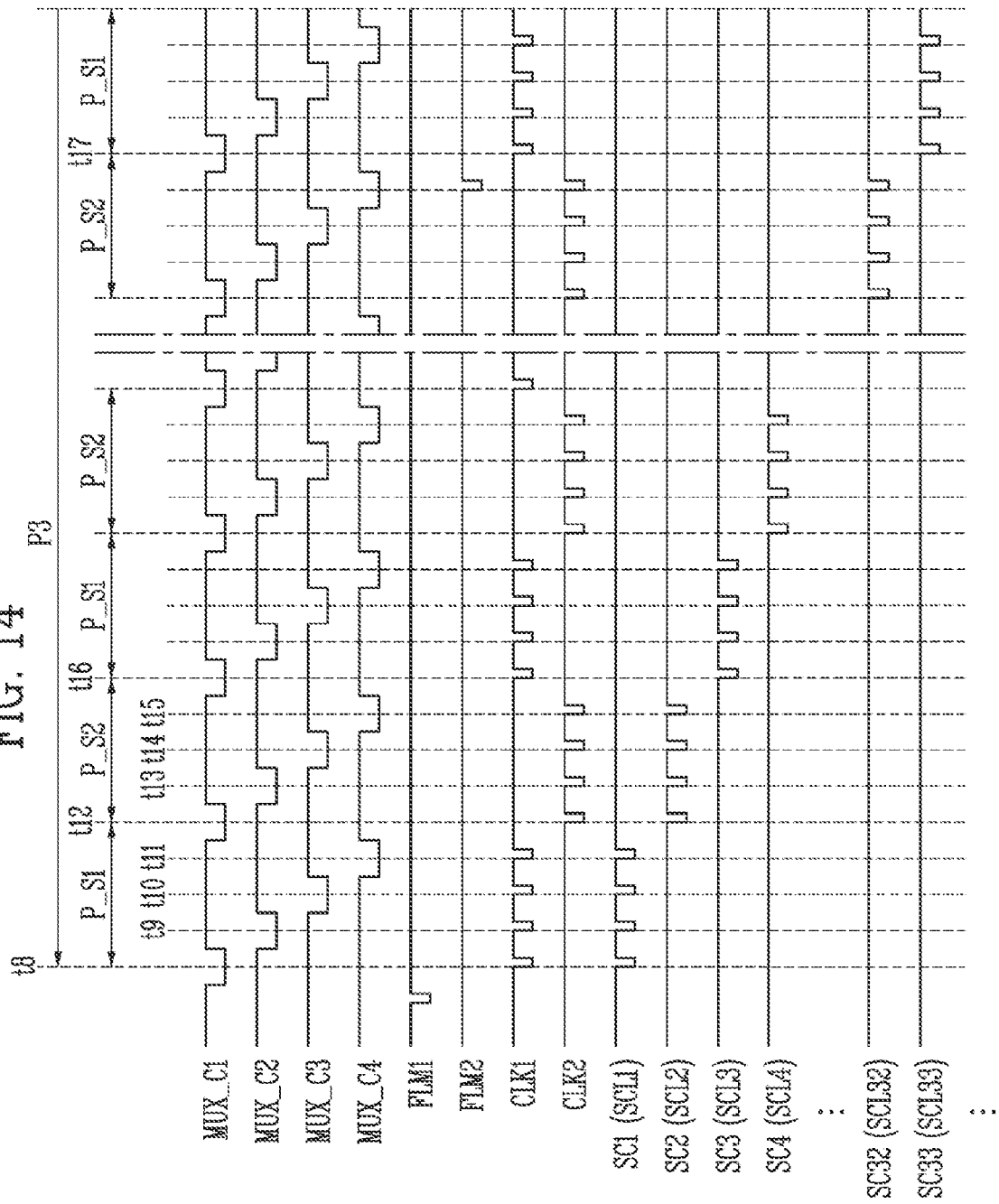
FIG. 14 is a waveform diagram for explaining an operation in a third period of the input sensing device of FIG. 5A according to some example embodiments of the present invention.

5A. FIG. 14 illustrates a waveform diagram for explaining an operation in a third period of the input sensing device of FIG. 5A.

Hereinafter, it will be described, as an example, that the 11th, 21st, 31st, and 41st unit blocks UB11, UB21, UB31, and UB41 described with reference to FIG. 6 and FIG. 7 are included in one unit sensing block USB. That is, according to local driving (or local sensing), only the 11th, 21st, 31st, and 41st unit blocks UB11, UB21, UB31, and UB41 included in the unit sensing block USB are activated, and for this purpose, only the first to fourth sub-reset drivers RSDR_S1, RSDR_S2, RSDR_S3, and RSDR_S4 and only the first to fourth sub-scan drivers SCDR_S1, SCDR_S2, SCDR_S3, and SCDR_S4 corresponding to the 11th, 21st, 31st, and 41st unit blocks UB11, UB21, UB31, and UB41 may be activated. The sub-reset drivers (for example, the fifth sub-reset driver RSDR_S5 and subsequent sub-reset drivers) and the sub-scan drivers (for example, the fifth sub-scan driver SCDR_S5 and subsequent sub-scan drivers) corresponding to the remaining unit blocks (for example, the fifty-first unit block UB51 and subsequent unit blocks) not included in the unit sensing block USB may be deactivated.

Referring to FIG. 5A to FIG. 14, one sensing period in which the input sensing device FDD performs one fingerprint sensing may include a first period P1, a second period P2, and a third period P3. As shown in FIG. 11, the first period P1, the second period P2, and the third period P3 may be classified based on a cycle change of the clock signals CLK1 and CLK2.

In the first period P1 and the second period P2, the reset enable signal RS_EN may have a turn-on voltage level (or a logic low level), and the scan enable signal SC_EN may have a turn-off voltage level (or a logic high level). Thus, the selector SWU of FIG. 10 connects the clock lines CLKL1 and CLKL2 and the start signal lines FLML to the reset driver RSDR, and the clock signals CLK1 and CLK2 and the start signals FLM1 to FLM40 may be provided only to the reset driver RSDR.

According to some example embodiments, in the first period P1, the controller CON may simultaneously (or concurrently) generate the first to fourth start signals FLM1 to FLM4 having a pulse of turn-on voltage level.

As shown in FIG. 12, the first to fourth start signals FLM1 to FLM4 for the 11th to 14th unit blocks UB11 to UB41 (see FIG. 7) at a first point of time ti in the first period P1 may simultaneously (or concurrently) have a pulse PLS of a turn-on voltage level.

Because the controller CON and the reset driver RSDR are connected by the selector SWU, the first to fourth start signals FLM1 to FLM4 and the clock signals CLK1 and CLK2 may be provided to the first to fourth sub-reset drivers RSDR_S1 to RSDR_S4 (see FIG. 7), and the first to fourth sub-reset drivers RSDR_S1 to RSDR_S4 (see FIG. 7) may simultaneously (or concurrently) output reset signals. For example, the first sub-reset driver RSDR_S1 may output the first reset signal RST1 of the turn-on voltage level synchronized with the first clock signal CLK1 in response to the first start signal FLM1 to the first reset line RSL1, and then, it may output the second reset signal RST2 of the turn-on voltage level synchronized with the second clock signal CLK2 by shifting the first reset signal RST1 to the second reset line RSL2. In this way, the first sub-reset driver RSDR_S1 may sequentially output the reset signals.

Similar to the first sub-reset driver RSDR_S1, the second sub-reset driver RSDR_S2 may output a 33rd reset signal RST33 of the turn-on voltage level to a 33rd reset line RSL33 in response to the second start signal FLM2, and then, it may output the thirty-fourth reset signal RST34 of the turn-on voltage level by shifting the 33rd reset signal RST33 to the thirty-fourth reset line RSL34. In this way, the second sub-reset driver RSDR_S2 may sequentially output the reset signals.

In addition, the third sub-reset driver RSDR_S3 may sequentially output the 65th reset signal RST65 and the 66th reset signal RST66 of the turn-on voltage level to the 65th reset line RSL65 and the 66th reset line RSL66 in response to the third start signal FLM3, and the fourth sub-reset driver RSDR_S4 may sequentially output the 97th reset signal RST97 and the 98th reset signal RST98 of the turn-on voltage level to the 97th reset line RSL97 and the 98th reset line RSL98 in response to the fourth start signal FLM4.

The first reset signal RST1 applied to the first reset line RSL1 (that is, the first reset line of the 11th unit block UB11 (see FIG. 7)), the 33rd reset signal RST33 applied to the 33rd reset line RSL33 (that is, the first reset line of the 21st unit block UB21 (see FIG. 7)), the 65th reset signal RST65 applied to the 65th reset line RSL65 (that is, the first reset line of the 31st unit block UB31 (see FIG. 7)), and the 97th reset signal RST97 applied to the 97th reset line RSL97 (that is, the first reset line of the 41st unit block UB41 (see FIG. 7)) may simultaneously (or concurrently) have the turn-on voltage level. Accordingly, some of the sensor pixels SPXL provided in the photo sensor PS may be simultaneously (or concurrently) initialized. That is, the unit blocks UB11, UB21, UB31, and UB41 may be simultaneously (or concurrently) and sequentially initialized.

Meanwhile, the fifth start signal FLMS applied to the fifth sub-reset driver RSDR_S5 corresponding to the unit blocks, for example, to the fifty-first unit block UB51 (see FIG. 7) not included in the unit sensing block USB (see FIG. 6), may be maintained at the turn-off voltage level. However, embodiments according to the present invention are not limited thereto, and according to some example embodiments, the fifth start signal FLM5 applied to the fifth sub-reset driver RSDR_S5 in the first period P1 may have the turn-off voltage level. That is, initialization may also be performed on inactive unit blocks (for example, unit blocks that are not previously activated and initialized).

According to some example embodiments, in the first period P1, the controller CON may generate the first to fourth start signals FLM1 to FLM4 having pulses of the turn-on voltage level a plurality of times.

As shown in FIG. 12, in a sub-period P_M (or multi-sensing period) within the first period P1, each of the first to fourth start signals FLM1 to FLM4 may have pulses of the turn-on voltage level two or more times. In this case, the sensor pixels SPXL provided in the photo sensor PS are repeatedly initialized, and thus a charge (that is, photoelectric converted charge) charged in the sensor pixels (SPXL) may be completely eliminated.

Meanwhile, in the first period P1, the clock signals CLK1 and CLK2 may have a pulse of turn-on voltage level every first cycle PW1.

According to some example embodiments, after the sub-period P_M (or in the second period P2), cycles of the dock signals CLK1 and CLK2 may be set to be larger than the cycle in the first period P1.

As shown in FIG. 12, at a third point of time t3, the first clock signal CLK1 may have a pulse of turn-on voltage level. Here, the third point of time t3 may be a point of time elapsed from a second point of time t2 by a predetermined time and a starting point of the second period P2. In addition, at a fourth point of time t4, the second clock signal CLK2 may have a pulse of turn-on voltage level. Here, the fourth point of time t4 may be a point of time elapsed by a second cycle PW2 from the second point of time t2. That is, in the second period P2, the dock signals CLK1 and CLK2 may have the second cycle PW2.

In the first period P1, the clock signals CLK1 and CLK2 have a relatively small first cycle PW1 so that the sensor pixels SPXL in the photo sensor PS may be initialized quickly and several times, and in the second period P2, the clock signals CLK1 and CLK2 may have a relatively large second cycle PW2 so that specific sensor pixels SPXL may generate a photoelectrically converted charge. For example, the second cycle PW2 may be 10 times or more larger than the first cycle PW1. The clock signals CLK1 and CLK2 may have the same cycle in each period. For example, the clock signals CLK1 and CLK2 may have the same second cycle PW2 in the second period P2.

According to some example embodiments, after the sub-period P_M, the controller CON may sequentially generate some of the start signals for specific unit blocks for fingerprint sensing.

When the 11th, 21st, 31st, and 41st unit blocks UB11, UB21, UB31, and UB41 described with reference to FIG. 7 are set as one unit sensing block USB (that is, a part of the photo sensor PS to be operated for fingerprint sensing), the controller CON may sequentially generate the first to fourth start signals FLM1 to FLM4. In other words, when a touch input occurs, the 11th, 21st, 31st, and 41st unit blocks UB11, UB21, UB31, and UB41) corresponding to an area in which the touch input is recognized may be activated to forma one unit sensing block USB. Meanwhile, other unit blocks (for example, the fifty-first unit block UB51) that does not form a unit sensing block USB are deactivated, and for this purpose, the controller CON may not generate start signals (for example, the fifth start signal FLM5) excluding the first to fourth start signals FLM1 to FLM4, or may maintain them at a turn-off voltage level.

As shown in FIG. 12 and FIG. 13, at the second point of time t2, which is an ending point of the sub-period P_M, only the first start signal FLM1 may have a pulse of turn-on voltage level. In this case, the first sub-reset driver RSDR_S1 (see FIG. 7) may sequentially generate the first to 32nd reset signals RST1 to RST32 in response to the first start signal FLM1. As shown in FIG. 13, the first reset signal RST1 may have the pulse of turn-on voltage level at the third point of time t3. At the fourth point of time t4, the second reset signal RST2 may have the pulse of turn-on voltage level. After that, the reset signals may have the turn-on voltage level sequentially, and the 32nd reset signal RST32 may have the pulse of turn-on voltage level just before a fifth point of time t5.

In addition, at the fifth point of time t5, only the second start signal FLM2 may have the pulse of turn-on voltage level. In this case, the second sub-reset driver RSDR_S2 may sequentially generate the 33rd to 64th reset signals RST33 to RST64 in response to the second start signal FLM2.

At a sixth point of time t6, only the third start signal FLM3 may have the pulse of turn-on voltage level. In this case, the third sub-reset driver RSDR_S3 may sequentially generate the 65th to 96th reset signals RST65 to RST96 in response to the third start signal FLM3.

At a seventh point of time t7, only the fourth start signal FLM4 may have the pulse of turn-on voltage level. In this case, the fourth sub-reset driver RSDR_S4 may sequentially generate the 97th to 128th reset signals RST97 to RST128 in response to the fourth start signal FLM4.

Meanwhile, the fifth start signal FLM5 (and other start signals) may be maintained at the turn-off voltage level after the sub-period (P_M). Accordingly, the 129th reset signal RST129 (and reset signals) may be maintained at the turn-off voltage level in the second period P2.

In the third period P3, the reset enable signal RS_EN may have the turn-off voltage level, and the scan enable signal SC_EN may have the turn-on voltage level. Thus, the selector SWU of FIG. 10 connects the clock lines CLKL1 and CLKL2 and the start signal lines FLML to the scan driver SCDR, and the dock signals CLK1 and CLK2 and the start signals FLM1 to FLM40 may be provided only to the scan driver SCDR.

According to some example embodiments, the third period P3 may include a first sub-period P_S1 and second sub-period P_S2 that are sequentially repeated, and the controller CON may generate the first dock signal CLK1 having pulses of a turn-on voltage level in the first sub-period P_S1, and the controller CON may generate the second dock signal CLK2 having pulses of the turn-on voltage level in the second sub-period P_S2. In the first sub-period P_S1, the second dock signal CLK2 may be maintained at the turn-off voltage level, and in the second sub-period P_S2, the first clock signal CLK1 may be maintained at the turn-off voltage level.

According to some example embodiments, a repetition cycle of each of the first sub-period P_S1 and the second sub-period P_S2 may be the same as the second cycle PW2 of the dock signals CLK1 and the CLK2 in the second period P2.

As shown in FIG. 14, at an eighth point of time t8, a ninth point of time t9, a tenth point of time t10, and an eleventh point of time t11, the first dock signal CLK1 may have pulses of a turn-on voltage level, respectively. Meanwhile, in the first sub-period P_S1 between the eighth point of time t8 and the twelfth point of time t12, corresponding to the first start signal FLM1 and the first clock signal CLK1, the first scan signal SC1 applied to the first scan line SCL1 may have pulses of the turn-on voltage level.

As shown in FIG. 14, at a twelfth point of time t12, a thirteenth point of time t13, a fourteenth point of time t14, and a fifteenth point of time t15, the second clock signal CLK2 may have pulses of a turn-on voltage level, respectively. In the second sub-period P_S2 between the twelfth point of time t12 and the sixteenth point of time t16, the second scan signal SC2 applied to the second scan line SCL2 may have pulses of the turn-on voltage level, corresponding to the second clock signal CLK2.

According to some example embodiments, the number of the pulses of the turn-on voltage level of the first clock signal CLK1 in the first sub-period P_S1 may be the same as the input/output ratio of the multiplexer MUX described with reference to FIG. 5A.

As shown in FIG. 14, at the eighth point of time t8, the first switch control signal MUX_C1 may have the turn-on voltage level. In this case, the first switch SW_M1 (see FIG. 5B) may be turned on, and the first read-out line RL1 and the first output line OL1 may be connected. At the eighth point of time t8, because the first scan signal SC1 has the turn-on voltage level, a sensing signal may be outputted from the first sensor pixel SPXL1 to the first read-out line RL1. Because the first read-out line RL1 and the first output line OL1 are connected, the sensing signal of the first sensor pixel SPXL1 may be outputted through the first output line OL1.

Similarly, at the ninth point of time t9, the second switch control signal MUX_C2 may have the turn-on voltage level.

In this case, the second switch SW_M2 (see FIG. 5B) may be turned on, and the second read-out line RL2 and the first output line OL1 may be connected. At the ninth point of time t9, because the first scan signal SC1 has the turn-on voltage level, a sensing signal may be outputted from the second sensor pixel SPXL2 to the second read-out line RL2. Because the second read-out line RL2 and the first output line OL1 are connected, the sensing signal of the second sensor pixel SPXL2 may be outputted through the first output line OL1.

In contrast, when the first scan signal SC1 (and first dock signal CLK1) has the turn-off voltage level at the ninth point of time t9, the sensing signal of the second sensor pixel SPXL2 outputted to the second read-out line RL2 at the eighth point of time t8 may be outputted through the second switch SW_M2. Noise may be introduced into the sensing signal of the second sensor pixel SPXL2 outputted to the second read-out line RL2 at the eighth point of time t8, due to the turn-on operation of the second switch SW_M2 and the parasitic capacitance between adjacent wires between the eighth point of time t8 and the ninth point of time t9.

According to some example embodiments of the present invention, because the first scan signal SC1 has the turn-on voltage level at the ninth point of time t9, a sensing signal that does not have the noise may be outputted through the second read-out line RL2 and the first output line OL1 from the second sensor pixel SPXL2. That is, the noise introduced into the sensing signal of the second sensor pixel SPXL2 may be reduced, and the accuracy of fingerprint sensing may be improved.

At the tenth point of time t10, the third switch control signal MUX_C3 may have the turn-on voltage level. In this case, the third switch SW_M3 (see FIG. 5B) may be turned on, and the third read-out line RL3 and the first output line OL1 may be connected. At the tenth point of time t10, because the first scan signal SC1 has the turn-on voltage level, a sensing signal may be outputted from the third sensor pixel SPXL3 to the third read-out line RL3. Because the third read-out line RL3 and the first output line OL1 are connected, the sensing signal of the third sensor pixel SPXL3 may be outputted through the first output line OL1.

At the eleventh point of time t11, the fourth switch control signal MUX_C4 may have the turn-on voltage level. In this case, the fourth switch SW_M4 (see FIG. 5B) may be turned on, and the fourth read-out line RL4 and the first output line OL1 may be connected. At the eleventh point of time t11, because the first scan signal SC1 has the turn-on voltage level, a sensing signal may be outputted from the fourth sensor pixel SPXL4 to the fourth read-out line RL4. Because the fourth read-out line RL4 and the first output line OL1 are connected, the sensing signal of the fourth sensor pixel SPXL4 may be outputted through the first output line OL1.

Meanwhile, the first to fourth switch control signals MUX_C1 to MUX_C4, the second dock signal CLK2, the second scan signal SC2, and the operation of the input sensing device FDD based on these signals at the twelfth point of time t12, the thirteenth point of time t13, the fourteenth point of time t14, and the fifteenth point of time t15, may be substantially the same as or similar to the first to fourth switch control signals MUX_C1 to MUX_C4, the first clock signal CLK1, the first scan signal SC1, and the operation of the input sensing device FDD based these signals at the eighth point of time t8, the ninth point of time t9, the tenth point of time t10, and the eleventh point of time t11, respectively. Therefore, some duplicated description may not be repeated.

After the sixteenth point of time t16, the scan driver SCDR may be sequentially output scan signals each having pulses of four turn-on voltage levels (that is, the third scan signal SC3, the fourth scan signal SC4, the 32nd scan signal SC32, and the 33rd scan signal SC33, and the 126th scan signal SC126, the 127th scan signal SC127, and the 128th scan signal SC128 shown in FIG. 11).

For example, as shown in FIG. 13 and FIG. 14, just before the seventeenth point of time t17 (that is, at a point of time when the 32nd scan signal SC32 is outputted to the 32nd scan line SCL32), the second start signal FLM2 may have the pulse of turn-on voltage level. In this case, the second sub-reset driver RSDR_S2 (see FIG. 7) may generate the 33rd scan signal SC33 in response to the second start signal FLM2, and may output the 33rd scan signal SC33 to the 33rd scan line SCL33.

As described with reference to FIG. 11 to FIG. 14, the input sensing device FDD may use the clock signals CLK1 and CLK2 having a relatively small cycle in the first period P1 to initialize the sensor pixels SPXL in the photo sensor PS, substantially simultaneously (or concurrently) and several times. In addition, the input sensing device FDD may use clock signals having a plurality of pulses consecutively in the third period P3 to provide a scan signal having a plurality of pulses to one scan line. Thus, it may be possible to prevent or reduce instances of noise being introduced into the sensing signals of the sensor pixels SPX by turn-on/off of the switches SW_M1 to SW_M4 in the multiplexer MUX, and to improve the accuracy of fingerprint sensing.

In addition, the selector SWU of FIG. 10 may provide the clock signals CLK1 and CLK2 and the start signals FLM1 to FLM5 to the reset driver RSDR in response to the reset enable signal RS_EN in the first period P1 and the second period P2, and may provide the clock signals CLK1 and CLK2 and the start signals FLM1 to FLM5 to the scan driver SCDR in response to the scan enable signal SC_EN in the third period P3. Therefore, the number of the pads and control lines (and output channels of the controller CON) for transmitting the dock signals CLK1 and CLK2 and the start signals FLM1 to FLM5 for the reset driver RSDR and the scan driver SCDR may be reduced, and the area and manufacturing cost of the input detection circuit ROIC (see FIG. 3) may be reduced.

While the present invention has been shown and described with reference to certain embodiments thereof, it will be understood by those skilled in the art that various changes in forms and details may be made therein without departing from the spirit and scope of the present invention as defined by the appended claims and their equivalents.

Therefore, the technical scope of embodiments according to the present disclosure may be determined by on the technical scope of the accompanying claims and their equivalents.

What is claimed is:

1. An input sensing device comprising:
a plurality of reset lines;
a plurality of scan lines;
a plurality of read-out lines;
a plurality of sensor pixels connected to the reset lines, the scan lines, and the read-out lines, wherein each of the sensor pixels is configured to be initialized in response to a reset signal provided through a corresponding reset line among the reset lines and to output a sensing signal to a corresponding read-out line among the read-out lines in response to a scan signal provided through a corresponding scan line among the scan lines;

a controller configured to generate at least one start signal and dock signals;

a selector configured to selectively provide the at least one start signal and the clock signals to first control lines or second control lines;

a reset driver connected to the first control lines and configured to supply reset signals to at least some of the reset lines based on the at least one start signal and the clock signals provided through the first control lines; and a scan driver connected to the second control lines and configured to supply scan signals to at least some of the scan lines based on the at least one start signal and the dock signals provided through the second control lines.

2. The input sensing device of claim 1, wherein the controller is configured to output the at least one start signal and the clock signals to reference control lines; and wherein the selector includes:
a first switching unit connected between the reference control lines and the first control lines, and configured to respectively connect the reference control lines and the first control lines in response to a reset enable signal; and a second switching unit connected between the reference control lines and the second control lines, and configured to respectively connect the reference control lines and the second control lines in response to a scan enable signal.

3. The input sensing device of claim 1, wherein each of the sensor pixels is divided into a plurality of unit blocks including at least one sensor pixel, wherein the reset driver includes sub-reset drivers respectively corresponding to the unit blocks, wherein each of the sub-reset drivers is configured to provide corresponding reset signals among the reset signals to a corresponding unit block among the unit blocks, and wherein the controller is configured to generate start signals respectively corresponding to the sub-reset drivers.

4. The input sensing device of claim 3, wherein each of the sub-reset drivers includes stages configured to respectively generate a corresponding reset signal while sequentially shifting a corresponding start signal among the start signals based on the clock signals.

5. The input sensing device of claim 3, wherein the scan driver includes sub-scan drivers respectively corresponding to the unit blocks, wherein each of the sub-scan drivers are configured to provide corresponding scan signals among the scan signals to a corresponding unit block among the unit blocks.

6. The input sensing device of claim 5, wherein a sensing period includes a first period, a second period, and a third period that are classified based on a cycle change of the dock signals, and wherein in the first period:
the controller is configured to concurrently generate the start signals having a pulse of a turn-on voltage level;
the selector is configured to provide the start signals and the clock signals to the first control lines; and
the sub-reset drivers are configured to concurrently output at least some of the reset signals in response to the start signals.

7. The input sensing device of claim 6, wherein in the first period, the controller is configured to generate start signals, wherein each of the start signals has a plurality of pulses of the turn-on voltage level.

8. The input sensing device of claim 6, wherein in the second period, the controller is configured to sequentially generate some of the start signals; and wherein in the second period, the selector is configured to provide the some of the start signals and the clock signals to the first control lines.

9. The input sensing device of claim 8, wherein the controller is configured to set a cycle of the clock signals in the second period to be greater than that of the clock signals in the first period.

10. The input sensing device of claim 6, further comprising:

a multiplexer that is connected between k read-out lines (where k is an integer of 2 or more) among the read-out lines and an output line, and that is configured to sequentially connect the k read-out lines to the output line.

11. The input sensing device of claim 10, wherein in the third period, the selector is configured to provide the start signals and the clock signals to the second control lines.

12. The input sensing device of claim 11, wherein the clock signals include a first clock signal and a second clock signal, wherein the third period includes a first sub-period and a second sub-period that are sequentially repeated;

wherein in the first sub-period, the controller is configured to generate the first clock signal having pulses of a turn-on voltage level and to maintain the second clock signal at a turn-off voltage level; and wherein in the second sub-period, the controller is configured to generate the second clock signal having pulses of the turn-on voltage level and to maintain the first clock signal at a turn-off voltage level.

13. The input sensing device of claim 12, wherein a number of pulses of the turn-on voltage level in the first sub-period is the k.

14. The input sensing device of claim 12, wherein a repetition cycle of the first sub-period and the second sub-period is the same as a cycle of the clock signals in the second period.

15. The input sensing device of claim 1, wherein each of the sensor pixels includes a photo diode;

a first transistor including a first electrode connected to a first power line, a second electrode, and a gate electrode connected to one electrode of the photo diode;

a second transistor including a first electrode connected to the second electrode of the first transistor, a second electrode connected to a corresponding read-out line among the read-out lines, and a gate electrode connected to a corresponding scan line among the scan lines;

a third transistor including a first electrode connected to a second power line, a second electrode connected to the gate electrode of the first transistor, and a gate electrode connected to a corresponding reset line among the reset lines; and a capacitor connected to the photo diode in parallel.

16. A display device comprising:
a display panel configured to display an image; and
an input sensing device on one surface of the display panel, wherein the input sensing device includes:
a plurality of reset lines;
a plurality of scan lines;
a plurality of read-out lines;
a plurality of sensor pixels connected to the reset lines, the scan lines, and the read-out lines, wherein each of the sensor pixels is configured to be initialized in response to a reset signal provided through a corresponding reset line among the reset lines, to sense light that is emitted from the display panel and reflected by a target object to generate a sensing signal, and to output the sensing signal to a corresponding read-out line among the read-out lines in response to a scan signal provided through a corresponding scan line among the scan lines;

a controller configured to generate at least one start signal and dock signals;

a selector configured to selectively provide the at least one start signal and the clock signals to first control lines or second control lines;

a reset driver connected to the first control lines and configured to supply reset signals to at least some of the reset lines based on the at least one start signal and the clock signals provided through the first control lines; and a scan driver connected to the second control lines and configured to supply scan signals to at least some of the scan lines based on the at least one start signal and the dock signals provided through the second control lines.

17. The display device of claim 16, wherein the display panel is configured to emit light in an area contacted by a target object based on touch position information provided from the outside, and wherein the input sensing device is locally driven corresponding to the area contacted by the target object.

18. The display device of claim 16, wherein each of the sensor pixels is divided into a plurality of unit blocks including at least one sensor pixel, wherein the reset driver includes sub-reset drivers respectively corresponding to the unit blocks, wherein each of the sub-reset drivers is configured to provide corresponding reset signals among the reset signals to a corresponding unit block among the unit blocks; and wherein the controller is configured to generate start signals respectively corresponding to the sub-reset drivers.

19. The display device of claim 18, wherein a sensing period includes a first period, a second period, and a third period that are classified based on a cycle change of the clock signals, and wherein in the first period:

the controller is configured to concurrently generate the start signals having a pulse of a turn-on voltage level;

the selector is configured to provide the start signals and the clock signals to the first control lines; and the sub-reset drivers are configured to concurrently output at least some of the reset signals in response to the start signals.

20. The display device of claim 19, wherein in the second period, the controller is configured to sequentially generate some of the start signals, and wherein in the second period, the selector is configured to provide the some of the start signals and the clock signals to the first control lines.

* * * * *